(12) United States Patent
Oda et al.

(10) Patent No.: US 10,043,664 B2
(45) Date of Patent: Aug. 7, 2018

(54) MULTILAYER STRUCTURE, METHOD FOR MANUFACTURING SAME, SEMICONDUCTOR DEVICE, AND CRYSTALLINE FILM

(71) Applicant: FLOSFIA INC., Kyoto-shi, Kyoto (JP)

(72) Inventors: Masaya Oda, Kyoto (JP); Akio Takatsuka, Kyoto (JP); Toshimi Hitora, Kyoto (JP)

(73) Assignee: FLOSFIA INC., Kyoto-shi, Kyoto (JP)

( * ) Notice: Subject to any disclaimer, the term of this patent is extended or adjusted under 35 U.S.C. 154(b) by 0 days.

(21) Appl. No.: 15/508,465

(22) PCT Filed: Aug. 28, 2015

(86) PCT No.: PCT/JP2015/074380
§ 371 (c)(1),
(2) Date: Mar. 2, 2017

(87) PCT Pub. No.: WO2016/035696
PCT Pub. Date: Mar. 10, 2016

(65) Prior Publication Data
US 2017/0278706 A1  Sep. 28, 2017

(30) Foreign Application Priority Data
Sep. 2, 2014 (JP) ................................. 2014-178601

(51) Int. Cl.
*H01L 29/10* (2006.01)
*H01L 21/02* (2006.01)
(Continued)

(52) U.S. Cl.
CPC .. *H01L 21/02565* (2013.01); *H01L 21/02628* (2013.01); *H01L 21/242* (2013.01); *H01L 29/04* (2013.01); *H01L 29/24* (2013.01)

(58) Field of Classification Search
CPC ......... H01L 21/02565; H01L 21/02628; H01L 21/242; H01L 21/02172; H01L 21/02614;
(Continued)

(56) References Cited

U.S. PATENT DOCUMENTS

2002/0110940 A1*  8/2002  Yamagata ........... H01L 27/3244
                                                                    438/22
2007/0080369 A1*  4/2007  Sakai .................... H01L 33/007
                                                                    257/103
(Continued)

FOREIGN PATENT DOCUMENTS

EP    2 942 803 A1   11/2015
JP    3015261 B2     12/1999
(Continued)

OTHER PUBLICATIONS

Akaiwa, K., and S. Fujita, "Electrical Conductive Corundum-Structured α-Ga$_2$O$_3$ Thin Films on Sapphire With Tin-Doping Grown by Spray-Assisted Mist Chemical Vapor Deposition," Japanese Journal of Applied Physics 51(7R):070203-1-070203-3, Jul. 2012.
(Continued)

*Primary Examiner* — Yosef Gebreyesus
(74) *Attorney, Agent, or Firm* — Christensen O'Connor Johnson Kindness PLLC

(57) ABSTRACT

A multilayer structure with excellent crystallinity and a semiconductor device of the multilayer structure with good mobility are provided. A multilayer structure includes: a corundum structured crystal substrate; and a crystalline film containing a corundum structured crystalline oxide as a major component, the film formed directly on the substrate or with another layer therebetween, wherein the crystal substrate has an off angle from 0.2° to 12.0°, and the
(Continued)

crystalline oxide contains one or more metals selected from indium, aluminum, and gallium.

20 Claims, 26 Drawing Sheets

(51) Int. Cl.
*H01L 29/24* (2006.01)
*H01L 29/04* (2006.01)
*H01L 21/24* (2006.01)

(58) Field of Classification Search
CPC . H01L 29/517; H01L 29/518; H01L 29/7869; H01L 29/04; H01L 23/291; H01L 45/146
See application file for complete search history.

(56) References Cited

U.S. PATENT DOCUMENTS

| | | | | |
|---|---|---|---|---|
| 2008/0170337 | A1* | 7/2008 | Hirata | B82Y 10/00 360/324.2 |
| 2012/0033485 | A1* | 2/2012 | Matsuzaki | G11C 11/405 365/149 |
| 2012/0045661 | A1* | 2/2012 | Kumaran | C09K 11/7758 428/690 |
| 2015/0194479 | A1 | 7/2015 | Kaneko et al. | |
| 2015/0225843 | A1 | 8/2015 | Oda et al. | |
| 2015/0325659 | A1 | 11/2015 | Hitora et al. | |

FOREIGN PATENT DOCUMENTS

| | | |
|---|---|---|
| JP | 2013-028480 A | 2/2013 |
| JP | 5397794 B1 | 1/2014 |
| JP | 5397795 B1 | 1/2014 |
| JP | 2014-072463 A | 4/2014 |
| JP | 2014-072533 A | 4/2014 |
| JP | 5528612 B1 | 6/2014 |

OTHER PUBLICATIONS

Extended European Search Report dated Jun. 22, 2017, issued in corresponding European Application No. 15837484.3, filed Aug. 28, 2015, 9 pages.

International Search Report dated Nov. 24, 2015, issued in corresponding International Application No. PCT/JP2015/074380, filed Aug. 28, 2015, 3 pages.

Oshima, Y., et al., "Quasi-Heteroepitaxial Growth of β-$Ga_2O_3$ on Off-Angled Sapphire (0 0 0 1) Substrates by Halide Vapor Phase Epitaxy," Journal of Crystal Growth 410:53-58, Jan. 2015.

Shiojiri, D., et al., "Homoepitaxial Growth of α-$Al_2O_3$ Thin Films on Atomically Stepped Sapphire Substrates by Pulsed Laser Deposition at Room-Temperature," Journal of the Ceramic Society of Japan 121(1413):467-469, May 2013.

Kaneko, K., "Growth and Physical Properties of Corundum—Structured Gallium Oxide Mixed Crystal Thin Film," doctoral dissertation, Kyoto University, Kyoto, Japan, Mar. 25, 2013, 120 pages.

Kumaran, R., "New Solid State Laser Crystals Created by Epitaxial Growth," doctoral dissertation, University of British Columbia, Vancouver, B.C., Sep. 2012, 190 pages.

* cited by examiner (b)

MULTILAYER STRUCTURE, METHOD FOR MANUFACTURING SAME, SEMICONDUCTOR DEVICE, AND CRYSTALLINE FILM

TECHNICAL FIELD

The present invention relates to a multilayer structure useful for a semiconductor device, a method of producing the same, a semiconductor device including the multilayer structure, and a crystalline film.

BACKGROUND ART

Semiconductor devices using gallium oxide ($Ga_2O_3$) with a large band gap attract more attention as next generation switching devices achieving high voltage, low loss, and high heat resistance. Such semiconductor devices are expected to be applied to power semiconductor devices (power devices), such as inverters. According to NPL 1, gallium oxide has a band gap that may be controlled by forming mixed crystal with indium or aluminum, individually, or in combination of them. Among them, InAlGaO based semiconductors represented by $In_{X'}Al_{Y'}Ga_{Z'}O_3$ ($0 \leq X' \leq 2$, $0 \leq Y' \leq 2$, $0 \leq Z' \leq 2$, $X'+Y'+Z'=1.5$ to $2.5$) are extremely attractive materials.

PTL 1 describes a high crystalline conductive $\alpha$-$Ga_2O_3$ thin film with a dopant (tetravalent tin) added thereto. The thin film described in PTL 1 is, however, not capable of maintaining sufficient withstand voltage and contains many carbon impurities, resulting in not yet satisfactory semiconductor properties including conductivity. It thus has been quite difficult to be used for a semiconductor device.

NPL 2 describes an $\alpha$-$Ga_2O_3$ thin film may be formed on sapphire by MBE. It however describes that, although the crystal grows up to a film thickness of 100 nm at a temperature of 450° C. or less, the quality of the crystal becomes worse with a film thickness more than that and it is not possible to obtain a film with a film thickness of 1 μm or more.

An $\alpha$-$Ga_2O_3$ thin film with a film thickness of 1 μm or more without crystal quality degradation has been, therefore, expected.

PTL 2 describes a method of producing an oxide crystal thin film by mist CVD using a bromide or an iodide of gallium or indium.

PTLs 3 to 5 describe multilayer structures having a semiconductor layer of a corundum crystal structure and an insulating film of a corundum crystal structure that are laminated on a base substrate of a corundum crystal structure.

PTLs 2 to 5 are publications on patents and a patent application by the present applicant.

CITATION LIST

Patent Literature

PTL 1: JP 2013-28480A
PTL 2: Japanese Patent No. 5397794
PTL 3: Japanese Patent No. 5343224
PTL 4: Japanese Patent No. 5397795
PTL 5: JP 2014-72533A

Non-Patent Literature

NPL 1: Kentaro KANEKO, "Fabrication and physical properties of corundum-structured alloys based on gallium oxide", Dissertation, Kyoto Univ., March 2013

NPL 2: Raveen Kumaran, "New Solid State Laser Crystals Created by Epitaxial Growth", A thesis submitted for the degree of doctor of philosophy, The University of British Columbia, September 2012

SUMMARY OF INVENTION

Technical Problem

It is an object of the present invention to provide a multilayer structure with excellent crystallinity, a semiconductor device of the laminated structure with good mobility, and a crystalline film with excellent crystallinity.

Solution to Problem

As a result of intensive examination to achieve the above object, the present inventors have found that a multilayer structure, including: a corundum structured crystal substrate; and a crystalline film containing a corundum structured crystalline oxide as a major component, the film formed directly on the substrate or with another layer therebetween, wherein the crystal substrate has an off angle from 0.2° to 12.0°, and the crystalline oxide contains one or more metals selected from indium, aluminum, and gallium has good semiconductor properties, in particular, mobility.

In addition, after making the above findings, the present inventors made further reviews to complete the present invention.

That is, the present invention relates to the inventions below.

[1] A multilayer structure, including: a corundum structured crystal substrate; and a crystalline film containing a corundum structured crystalline oxide as a major component, formed directly on the substrate or with another layer therebetween, wherein the crystal substrate has an off angle from 0.2° to 12.0°, and the crystalline oxide contains one or more metals selected from indium, aluminum, and gallium.

[2] The structure of [1] above, wherein the off angle of the crystal substrate is from 1° to 8°.

[3] The structure of [1] or [2] above, wherein the crystal substrate is a c-, m-, a-, or r-plane sapphire substrate.

[4] The structure of any one of [1] to [3] above, wherein a thickness of the crystalline film is 1 μm or more.

[5] The structure of any one of [1] to [4] above, wherein a center line average roughness(Ra) of a film surface of the crystalline film is 10 nm or less and a maximum difference in elevation (P-V value) of the fil surface is 100 nm or less, measured using an atomic force microscope.

[6] The structure of any one of [1] to [5] above, wherein the crystalline oxide is a semiconductor.

[7] The structure of [6] above, wherein the crystalline film further contains a dopant.

[8] A method of producing a multilayer structure, including: a first step of atomizing a raw-material solution into a mist; a second step of supplying a carrier gas to the mist to carry the mist onto a substrate using the carrier gas; and a third step of causing the mist to thermally react to form a crystalline film containing a crystalline oxide on all or part of a surface of the substrate, wherein the substrate is a corundum structured crystal substrate, the crystal substrate has an off angle from 0.2° to 12.0°, and the raw-material solution contains one or more metals selected from indium, aluminum, and gallium.

[9] The method of [8] above, wherein the thermal reaction is carried out at a temperature from 400° C. to 700° C.

[10] The method of [8] or [9] above, wherein the off angle of the crystal substrate is from 2° to 5°.

[11] The method of any one of [8] to [10] above, wherein the crystal substrate is a c-, m-, a-, or r-plane sapphire substrate.

[12] A semiconductor device, including: the laminated structure of [6] or [7] above; and an electrode.

[13] A crystalline film, including a corundum structured crystalline oxide as a major component, wherein the crystalline film has an off angle from 0.2° to 12.0°, and the crystalline oxide contains one or more metals selected from indium, aluminum, and gallium.

[14] The crystalline film of [13] above, wherein the off angle of the crystalline film is from 1° to 8°.

[15] The crystalline film of [13] or [14] above, wherein the crystalline film is a c-, m-, a-, or r-plane crystalline film.

[16] The crystalline film of any one of [13] to [15] above, wherein a film thickness of the crystalline film is 1 µm or more.

[17] The crystalline film of any one of [13] to [16] above, wherein a center line average roughness (Ra) of a film surface of the crystalline film is 10 nm or less and a maximum difference in elevation (P-V value) of the film surface is 100 nm or less, measured using an atomic force microscope.

[18] The crystalline film of any one of [13] to [17], wherein the crystalline oxide is a semiconductor.

[19] The crystalline film of [18] above, wherein the crystalline film further contains a dopant.

[20] A semiconductor device, including: the crystalline film of [18] or [19] above; and an electrode.

Advantageous Effects of Invention

The multilayer structure of the present invention is excellent in crystallinity, the semiconductor device of the multilayer structure is good in mobility, and the crystalline film is excellent in crystallinity.

DESCRIPTION OF EMBODIMENTS

Figure 1:
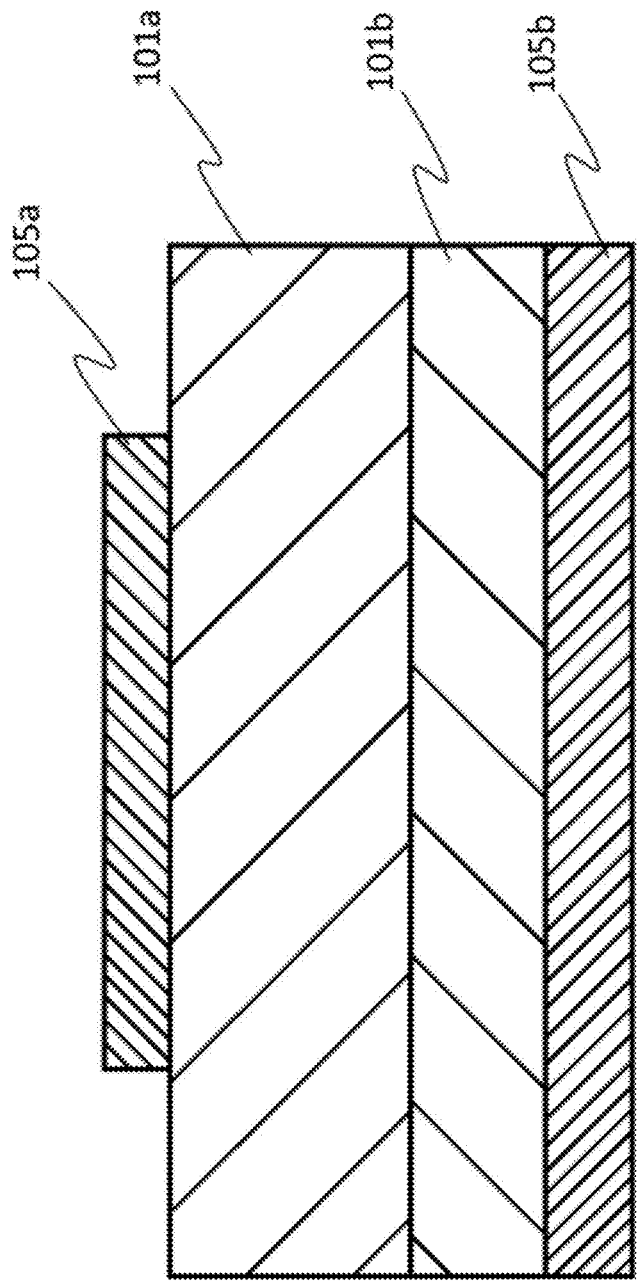
FIG. 1 is a diagram schematically illustrating a preferred example of a Schottky barrier diode (SBD) of the present invention.

A multilayer structure of the present invention includes: a corundum structured crystal substrate; and a crystalline film containing a corundum structured crystalline oxide as a major component, the film formed directly on the substrate or with another layer therebetween, wherein the crystal substrate has an off angle from 0.2° to 12.0°, and the crystalline oxide contains one or more metals selected from indium, aluminum, and gallium.

The crystal substrate is not particularly limited as long as the substrate has a corundum structure and has an off angle from 0.2° to 12.0°. Such a corundum structured crystal substrate is not particularly limited as long as the substrate is capable of supporting the crystalline film and all or part of the substrate has a corundum structure. The presence of a corundum structure may be identified by an X-ray diffractometer. Examples of the crystal substrate include a substrate containing a corundum structured crystal as a major component. The substrate containing a corundum structured crystal as a major component is not particularly limited as long as the substrate contains 50% or more of a corundum structured crystal. In the present invention, the substrate preferably contains 70% or more, and more preferably 90% or more, of the material. Examples of the substrate containing a corundum structured crystal as a major component include a sapphire substrate (e.g., c-plane sapphire substrate) and an a-gallium oxide substrate. In the present invention, the thickness of the crystal substrate is not particularly limited to, but is preferably from 50 to 2000 µm and more preferably from 200 to 800 µm.

In the present invention, the crystal substrate is preferably a sapphire substrate (e.g., a c-plane sapphire substrate, an m-plane sapphire substrate, an a-plane sapphire substrate, or an r-plane sapphire substrate, etc.) or an α-gallium oxide substrate. The use of such a preferred base substrate allows further reduction in the carbon content of impurities, the carrier concentration, and the half-width of the crystalline semiconductor film compared with a case of using another substrate.

The crystal substrate has an off angle from 0.2° to 12.0°, and in the present invention, the off angle is preferably approximately from 1° to 8° and more preferably approximately from 2° to 5°. Such a preferred off angle causes even more excellent semiconductor properties, in particular the mobility, of the crystalline film formed on the crystal substrate. The "off angle" of the crystal substrate means an angle formed by a surface of the substrate and a crystal growth surface.

In the present invention, such a crystal substrate with the off angle maybe produced in a conventional method. Examples of the method include known technique, such as polishing, to give the off angle to the crystal substrate. In the present invention, after giving the off angle to the crystal substrate, further known process may be applied. Examples of such process include providing a multi-step structure by, arranging micropores or microspikes after polishing and then carrying out a heat treatment.

In the present invention, the crystalline film, containing a corundum structured crystalline oxide as a major component is formed directly on the corundum structured crystal substrate or with another layer therebetween. The crystalline film is not particularly limited as long as the film contains a corundum structured crystalline oxide as a major component and is preferably an epitaxial film formed by epitaxial growth. In the present invention, the crystalline oxide contains one or more metals selected from indium, aluminum, and gallium as a major component, preferably contains at least indium and/or gallium as a major component and more preferably contains at least gallium as a major component. The "major component" in the present invention means that the corundum structured crystalline oxide is preferably contained 50% or more based on the entire components of the crystalline film, more preferably 70% or more, even more preferably 90% or more, and may be contained 100%. Being formed by epitaxial growth on the crystal substrate, the crystalline film has an off angle approximately from 0.2° to 12.0°. In the present invention, the off angle is preferably approximately from 1° to 8° and more preferably approximately from 2° to 5°. Such a preferred off angle causes even more excellent semiconductor properties, in particular the mobility, of the crystalline film. The "off angle" of the crystalline film means an angle formed by a crystalline film surface and a crystal growth surface.

In the present invention, the crystalline oxide is preferably a semiconductor and the crystalline film preferably further contains a dopant. When the crystalline oxide is a semiconductor, the semiconductor properties, particularly the mobility, are excellent. The crystalline oxide does not have to be a semiconductor. In the present invention, even when the crystalline oxide is not a semiconductor, the crystalline film may further contain a dopant and thus the doping may vary the absorption wavelength or form optical crystal.

Examples of the semiconductor include a crystalline oxide semiconductor containing one or more metals selected from indium, aluminum, and gallium as a major component. In the present invention, such a corundum structured crystalline oxide semiconductor preferably contains at least indium and/or gallium as a major component and more preferably contains at least gallium as a major component. In the present invention, a total atomic ratio of gallium, indium, and aluminum in metal elements contained in the crystalline film is preferably 0.5 or more and more preferably 0.8 or more. As preferred composition when the crystalline oxide semiconductor contains gallium, the atomic ratio of gallium in metal elements contained in the crystalline film is preferably 0.5 or more and more preferably 0.8 or more.

Examples of the dopant include n type dopants, such as tin, germanium, silicon, titanium, zirconium, vanadium, or niobium, or p type dopants. The dopant may have a concentration in general approximately from $1\times10^{16}/cm^3$ to $1\times10^{22}/cm^3$. When the concentration of the dopant is a low concentration of, for example, approximately $1\times10^{17}/cm^3$ or less and, for example, an n type dopant is used, it is possible to make an n– type semiconductor or the like. In another example, according to the present invention, when the dopant is contained in a high concentration of approximately $1\times10^{20}/cm^3$ or more and, for example, an n type dopant is used, it is possible to make an n+ type semiconductor or the like. In the present invention, the n type dopant is preferably tin, germanium, silicon, titanium, zirconium, vanadium, or niobium, and more preferably tin, germanium, or silicon. To form an n– type semiconductor layer, the concentration of the n type dopant in the crystalline film is preferably approximately from $1\times10^{13}$ to $5\times10^{17}/cm^3$ and more preferably approximately from $1\times10^{15}$ to $1\times10^{17}/cm^3$. To form an n+ type semiconductor layer, the concentration of the n type dopant in the crystalline film is preferably a concentration of approximately $1\times10^{17}/cm^3$ or more and more preferably approximately from $3\times10^{17}/cm^3$ to $3\times10^{19}/cm^3$. As just described, the dopant may be contained in the crystalline film to obtain a crystalline film with excellent electrical characteristics.

The crystalline film may be formed directly on the crystal substrate or may be formed with another layer therebetween. Examples of such another layer include a corundum structured crystal thin film of another composition, a crystal thin film with other than a corundum structure, or an amorphous thin film. The crystalline film may have a single layer structure or a multilayer structure. An identical layer may include two or more crystalline phases. Having a multilayer structure, the crystalline film is configured by laminating, for example, an insulating thin film and a conductive thin film, while the film in the present invention is not limited to this. When a multilayer structure is configured by laminating an insulating thin film and a conductive thin film, the insulating thin film and the conductive thin film may have the same composition or composition different from each other. The thickness ratio of the conductive thin film to the insulating thin film is not particularly limited. The ratio of (thickness of conductive thin film) / (thickness of insulating thin film) is, for example, preferably from 0.001 to 100 and more preferably from 0.1 to 5. Such a more preferred ratio may be specifically, for example, 0.1, 0.2, 0.3, 0.4, 0.5, 0.6, 0.7, 0.8, 0.9, 1, 1.1, 1.2, 1.3, 1.4, 1.5, 1.6, 1.7, 1.8, 1.9, 2, 3, 4, and 5 or may be ranged between any two of the numbers listed here as examples.

In the present invention, the crystalline film may be formed by mist epitaxy directly on the crystal substrate or with another layer therebetween.

The mist epitaxy is not particularly limited as long as the film formation method includes: (1) atomizing a raw-material solution into a mist; (2) supplying a carrier gas to the mist to carry the mist onto a crystal substrate by the carrier gas; and (3) causing the mist to thermally react to form a crystalline film of a crystalline oxide on all or part of a surface of the substrate. More specific examples of the mist epitaxy include mist CVD.

In (1) above, a mist is generated by atomizing a raw-material solution. For (1), a mist generator may be used to generate a mist by atomizing a raw-material solution. The mist generator is not particularly limited as long as it is capable of generating a mist by atomizing a raw-material solution. The mist generator may be a known one, and in the present invention, a mist is preferably generated by atomizing a raw material using ultrasonic waves. The raw-material solution is described later.

In (2) above, a carrier gas is supplied to the mist and the mist is carried onto the crystal substrate by the carrier gas. The carrier gas is not particularly limited as long as it is in a gaseous state and capable of carrying the mist, generated by atomizing the raw-material solution, onto the crystal substrate. The carrier gas is not particularly limited, and examples of the carrier gas include inert gases, such as an oxygen gas, a nitrogen gas, and an argon gas, and reducing gases, such as a forming gas and a hydrogen gas.

In (3) above, the mist is caused to thermally react to form a crystalline film on all or part of a surface of the substrate. In (3), a tube furnace may be preferably used that is capable of forming a film in a supply pipe by carrying the mist onto the crystal substrate by the carrier gas. The reaction temperature is not particularly limited as long as it is a temperature allowing a thermal reaction of the raw-material solution. In the present invention, a thermal reaction is preferably carried out at a temperature from 400° C. to 700° C. and more preferably from 500° C. to 700° C.

Figure 19A:
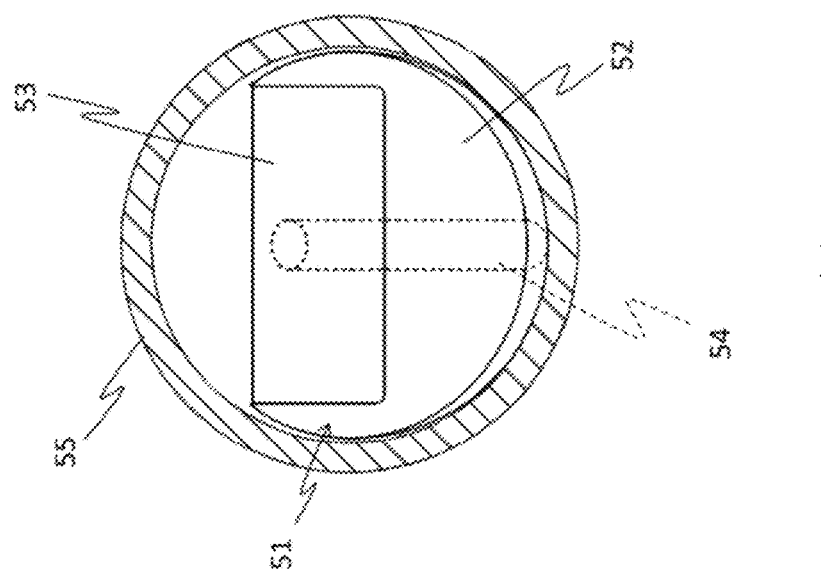
FIGS. 19A to 19B show diagrams to illustrate a susceptor used in Examples.
Figure 19B:
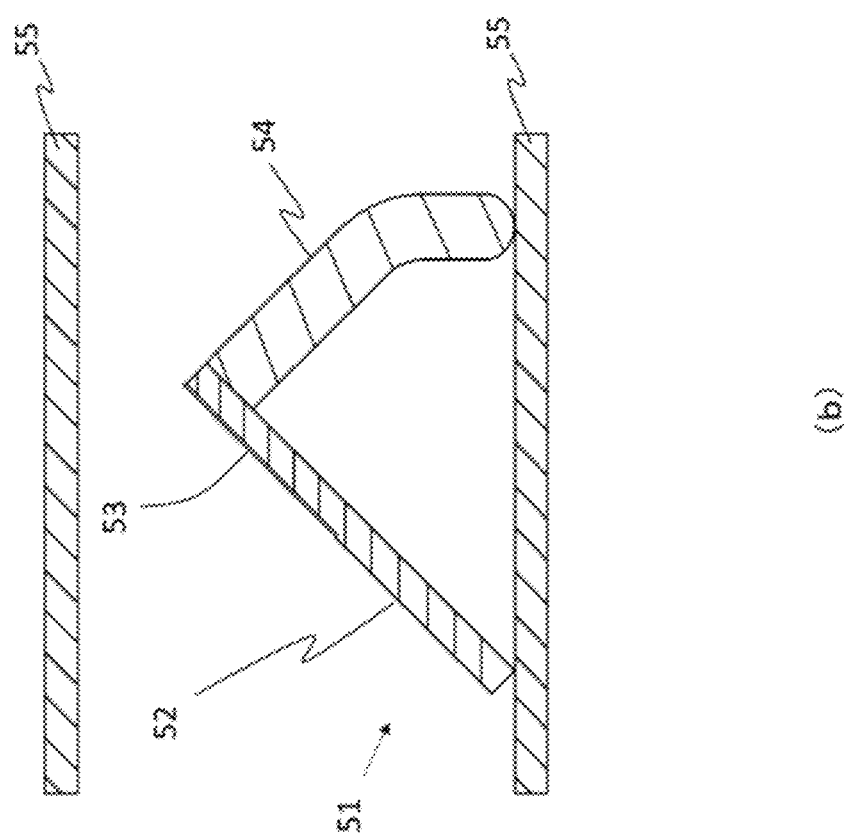
Figure 20:
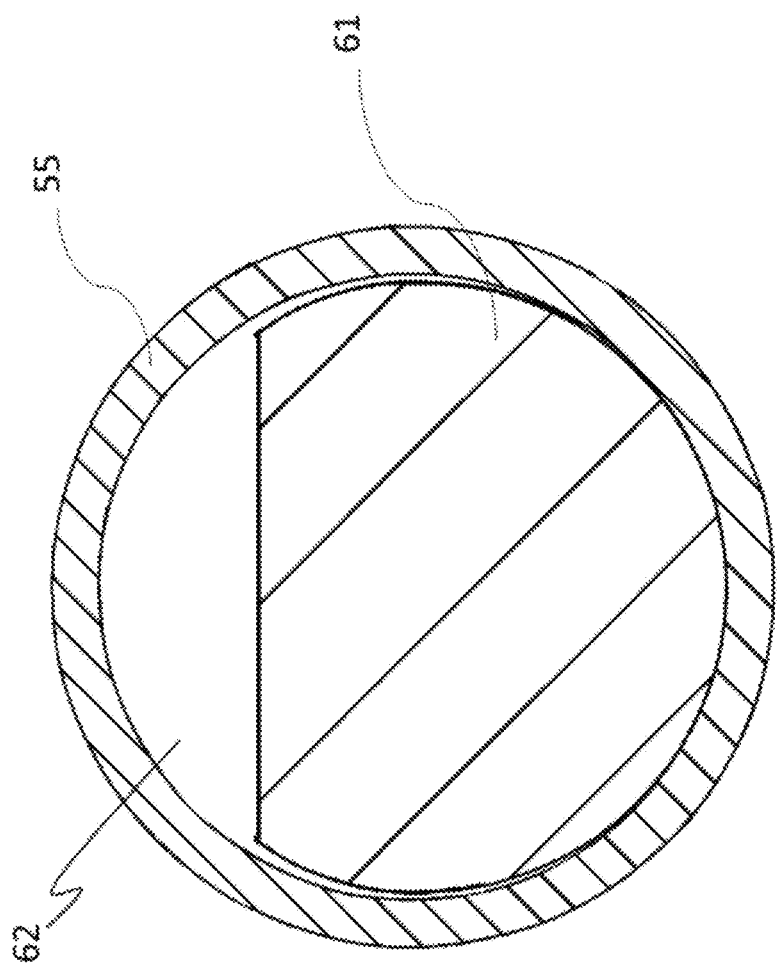
FIG. 20 is a diagram illustrating relationship of cross sections between the susceptor and a supply pipe used in Examples.

In the present invention, as a susceptor for film formation in the supply pipe in (3), susceptors illustrated in, for example, FIGS. 19A to 19B or FIG. 20 are preferably used.

FIGS. 19A to 19B illustrate an embodiment of the susceptor. A susceptor 51 illustrated in FIGS. 19A to 19B is provided with a mist accelerator 52, a substrate holder 53, and a support unit 54. The support unit 54 is in a rod shape and configured to have a contact angle of the support unit 54 with a supply pipe 55 of approximately 90° by changing the angle of the unit at some point. Although such configuration improves the stability of the susceptor 51, the shape of the support unit 54 in the present invention is not particularly limited and various shapes may be applied as appropriate.

FIG. 19A illustrates a cross section inside the supply pipe toward the substrate in the direction from upstream to downstream of the mist. It is seen from the drawing that a substrate-side surface of the supply pipe has an outer circumference in a semicircular shape, which is a shape approximately identical to an inner circumference of the supply pipe. FIG. 19B illustrates cross sections of the supply pipe, the crystal substrate, and the susceptor taking the upstream of the mist on the left and the downstream on the right. Although the mist is prone to precipitate in the supply pipe due to its properties, a susceptor 101 is configured to have an inclined mist accelerator 102 to raise the precipitated mist by acceleration, thereby delivering the mist onto a crystal substrate 103.

FIG. 20 illustrates, in the supply pipe 55, a region for the susceptor and the substrate illustrated in FIGS. 19A to 19B as a substrate-susceptor region 61 and a region to exhaust unreacted mist as an exhaust region 62, showing the relationship between a total area of the susceptor and the crystal substrate and an area of the exhaust region. In the present invention, as illustrated in FIG. 20, in the cross section inside the supply pipe divided into a susceptor region occupied by the susceptor, a region for the substrate, and the exhaust region to exhaust unreacted mist, the total area of the susceptor region and the crystal substrate is preferably greater than the area of the exhaust region. Use of such a preferred susceptor enables acceleration of the mist on the crystal substrate to obtain a more homogeneous and thicker crystalline film.

In the present invention, for the crystalline film formation, a dopant may be used to perform doping. In the present invention, doping is preferably performed by incorporating an abnormal grain inhibitor into the raw-material solution. The doping by incorporating an abnormal grain inhibitor into the raw-material solution enables production of a crystalline film excellent in surface smoothness. The amount of doping is not particularly limited as long as the objects of the present invention are not impaired, and preferably at a molar ratio from 0.01% to 10% in the raw material and more preferably from 0.1% to 5%.

The abnormal grain inhibitor means to have an effect of inhibiting by-product particles in the film formation process. The inhibitor is not particularly limited as long as the crystalline film has a surface roughness (Ra) of, for example, 0.1 μm or less. In the present invention, the abnormal grain inhibitor is preferably made from at least one selected from Br, I, F, and Cl. For stable film formation, introduction of Br or I in the film as the abnormal grain inhibitor enables inhibition of deterioration of the surface roughness due to abnormal grain growth. Although the amount of the abnormal grain inhibitor is not particularly limited as long as abnormal grains are inhibited, the amount is preferably 50% or less at a volume ratio in the raw-material solution, more preferably 30% or less, and most preferably in a range from 1% to 30%. Use of the abnormal grain inhibitor in such a preferred range enables its function as an abnormal grain inhibitor, and the abnormal grain in the crystalline film is thus inhibited to smooth the surface.

A method of forming a crystalline film is not particularly limited as long as the objects of the present invention are not impaired. The film may be formed by reaction of a raw material by combining, for example, a gallium compound with an indium compound, an aluminum compound, or the like as desired in accordance with the composition of the crystalline film. That is, the raw-material solution contains one or more metals selected from indium, aluminum, and gallium. This enables crystal growth of the crystalline film from the substrate side. The gallium compound may be a product using gallium metal as starting material to be changed into a gallium compound immediately before film formation. Examples of the gallium compound include organic metal complexes (e.g., acetylacetonato complex, etc.), halides (e.g., fluoride, chloride, bromide, iodide, etc.), or the like of gallium, and in the present invention, a halide (e.g., fluoride, chloride, bromide, iodide, etc.) is preferably used. Film formation by mist CVD using a halide as the raw-material compound enables substantial exclusion of carbon from the crystalline film.

More specifically, the crystalline film may be formed by supplying raw material fine particles generated from a raw-material solution in which a raw-material compound is dissolved to a film formation chamber and causing the raw-material compound to thermally react in the film formation chamber using the susceptor. The solvent of the raw-material solution is not particularly limited to, but is preferably water, a hydrogen peroxide solution, or an organic solvent. In the present invention, the raw-material compound is usually caused to react in the presence of a dopant raw material. The dopant raw material is preferably incorporated in the raw-material solution to be atomized together with or separately from the raw-material compound. The amount of carbon contained in the crystalline film is thus less than that in the dopant, and preferably carbon is not substantially contained in the crystalline film. The crystalline film of the present invention also preferably contains halogen (preferably Br) to exhibit good semiconductor properties. Examples of the dopant raw material include simple substances of metal, such as tin, germanium, silicon, titanium, zirconium, vanadium, and niobium, compounds thereof (e.g., halides, oxides, etc.), or the like.

Film formation as above enables industrially advantageous production of a crystalline film with excellent crystallinity. Formation of the crystalline film on the crystal substrate by the preferred method allows a center line average roughness (Ra) of a film surface of the crystalline film to be 10 nm or less and a maximum difference in elevation (P-V value) of the film surface to be 100 nm or less, measured using an atomic force microscope. In the present invention, the film thickness of 1 μm or more, preferably 3 μm or more, may be formed without impairing the crystallinity by appropriately adjusting film formation time.

In the present invention, annealing may be performed after film formation. The temperature for annealing is not particularly limited to, but is preferably 700° C. or less, more preferably from 300° C. to 700° C., and most preferably from 300° C. to 550° C. Annealing at such a preferred temperature more preferably enables adjustment of the carrier concentration in the crystalline film. Although the annealing time is not particularly limited as long as the objects of the present invention are not impaired, the time is preferably from 10 seconds to 10 hours and more preferably from 10 seconds to 1 hour.

When the crystalline oxide is a semiconductor, the multilayer structure may be used for a semiconductor device directly or by applying further process, such as machining, as desired. When the multilayer structure is used for a semiconductor device, the multilayer structure may be directly used for the semiconductor device or may be used by further forming another layer (e.g., insulating layer, semi-insulating layer, semiconductor layer, buffer layer, intermediate layer, etc.) or the like.

The multilayer structure of the present invention is useful for various semiconductor devices and is particularly useful for power devices. Semiconductor devices may be classified into lateral elements (lateral devices) having electrodes formed on one side of the semiconductor layer and vertical elements (vertical devices) having electrodes respectively on both sides of front and rear of the semiconductor layer. In the present invention, the multilayer structure may be preferably used for a lateral device and a vertical device. Examples of the semiconductor device include a Schottky barrier diode (SBD), a metal semiconductor field effect transistor (MESFET), a high electron mobility transistor (HEMT), a metal oxide semiconductor field effect transistor (MOSFET), a static induction transistor (SIT), a junction field effect transistor (JFET), an insulated gate bipolar transistor (IGBT), a light emitting diode, or the like. In the present invention, the semiconductor device is preferably an SBD, a MOSFET, an SIT, a JFET, or an IGBT and more preferably an SBD, a MOSFET, or an SIT. In the present invention, the semiconductor device may exclude a p type semiconductor layer.

The following descriptions are given to preferred examples of a crystalline semiconductor film with the semiconductor structure applied to an n type semiconductor layer (n+ type semiconductor, n− type semiconductor, etc.) with reference to the drawings while the present invention is not limited to these examples. As long as the objects of the present invention are not impaired, the semiconductor devices listed below may contain still another layer (e.g., insulating layer, semi-insulating layer, conductor layer, semiconductor layer, buffer layer, intermediate layer, etc.) and also a buffer layer may be omitted appropriately.

(SBD)

FIG. 1 illustrates an example of a Schottky barrier diode (SBD) according to the present invention. The SBD in FIG. 1 is provided with an n− type semiconductor layer 101a, an n+ type semiconductor layer 101b, a Schottky electrode 105a, and an ohmic electrode 105b.

Materials for the Schottky electrode and the ohmic electrode may be known electrode materials. Examples of such an electrode material include metal, such as Al, Mo, Co, Zr, Sn, Nb, Fe, Cr, Ta, Ti, Au, Pt, V, Mn, Ni, Cu, Hf, W, Ir, Zn, In, Pd, Nd, and Ag, and alloys thereof, metal oxide conductive films, such as tin oxide, zinc oxide, indium oxide, indium tin oxide (ITO), and indium zinc oxide (IZO), organic conductive compounds, such as polyaniline, polythiophene, and polypyrrole, and mixtures thereof, or the like.

The Schottky electrode and the ohmic electrode may be formed by known means, such as vacuum deposition and sputtering, for example. More specifically, the Schottky electrode may be formed by, for example, laminating a layer of Mo and a layer of Al and patterning the layer of Mo and the layer of Al using a photolithography technique.

When reverse bias is applied to the SBD in FIG. 1, a depletion layer, not shown, expands in the n− type semiconductor layer 101a to make a high voltage SBD. When forward bias is applied, electrons flow from the ohmic electrode 105b to the Schottky electrode 105a. The SBD thus using the semiconductor structure is excellent for high voltage and high current applications, achieves high switching speed, and excellent in withstand voltage and reliability.

Figure 2:
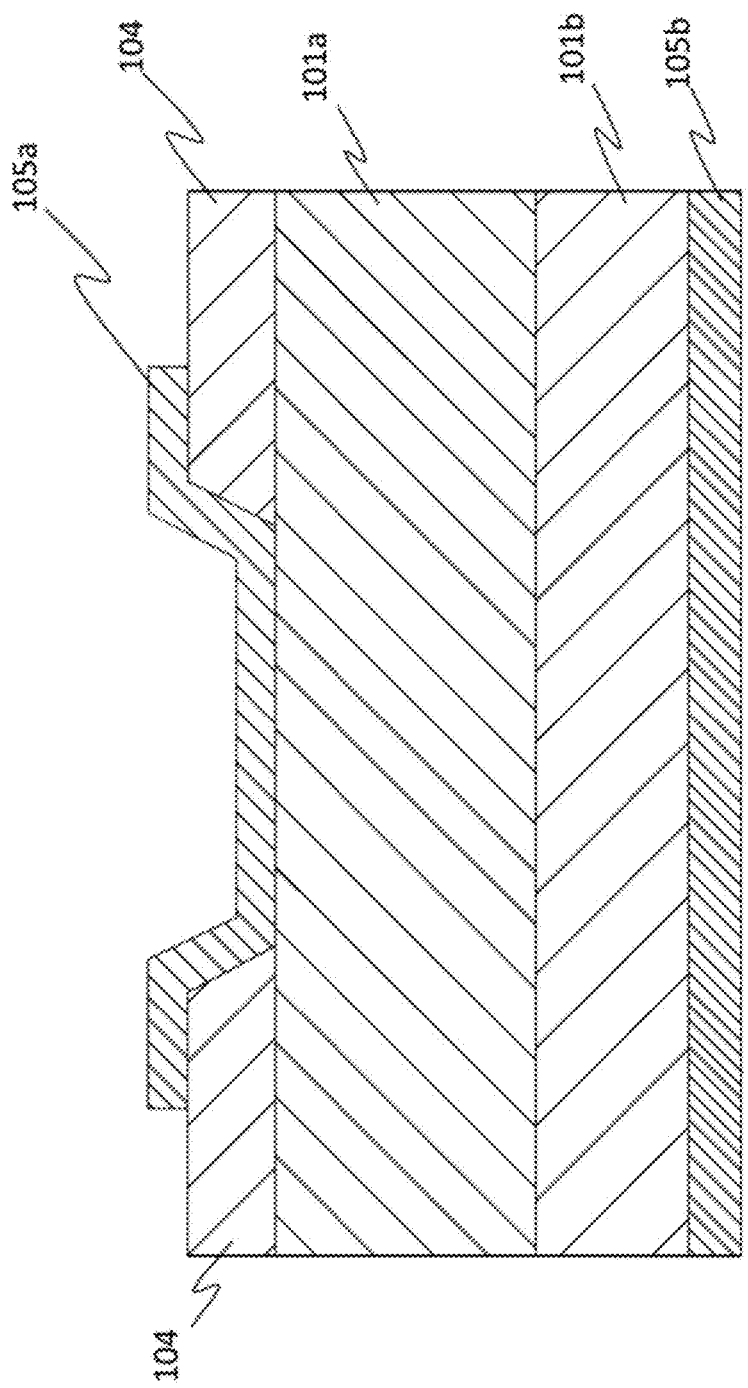
FIG. 2 is a diagram schematically illustrating another preferred example of the Schottky barrier diode (SBD) of the present invention.

FIG. 2 illustrates another example of a Schottky barrier diode (SBD) according to the present invention. In addition to the configuration of the SBD in FIG. 1, the SBD in FIG. 2 is further provided with an insulating layer 104. More specifically, this SBD is provided with an n− type semiconductor layer 101a, an n+ type semiconductor layer 101b, a Schottky electrode 105a, an ohmic electrode 105b, and an insulating layer 104.

Examples of a material for the insulating layer 104 include GaO, AlGaO, InAlGaO, AlInZnGaO$_4$, AlN, Hf$_2$O$_3$, SiN, SiON, Al$_2$O$_3$, MgO, GdO, SiO$_2$, Si$_3$N$_4$, or the like. In the present invention, the material preferably has a corundum structure. Use of a corundum structured insulator for the insulating layer enables good development of the functions of semiconductor properties at the interface. The insulating layer 104 is provided between the n− type semiconductor layer 101a and the Schottky electrode 105a. The insulating layer may be formed by known means, such as sputtering, vacuum deposition, and CVD, for example.

Formation, materials, and the like for the Schottky electrode and the ohmic electrode are same as those in the case of the SBD in FIG. 1 above. The electrodes may be formed by known means, such as sputtering, vacuum deposition, compression bonding, and CVD, for example, and made from metal, such as Al, Mo, Co, Zr, Sn, Nb, Fe, Cr, Ta, Ti, Au, Pt, V, Mn, Ni, Cu, Hf, W, Ir, Zn, In, Pd, Nd, and Ag, and alloys thereof, metal oxide conductive films, such as tin oxide, zinc oxide, indium oxide, indium tin oxide (ITO), and indium zinc oxide (IZO), organic conductive compounds, such as polyaniline, polythiophene, and polypyrrole, and mixtures thereof, or the like.

The SBD in FIG. 2 has, compared with the SBD in FIG. 1, even more excellent in insulating properties and higher current controllability.

Figure 3:
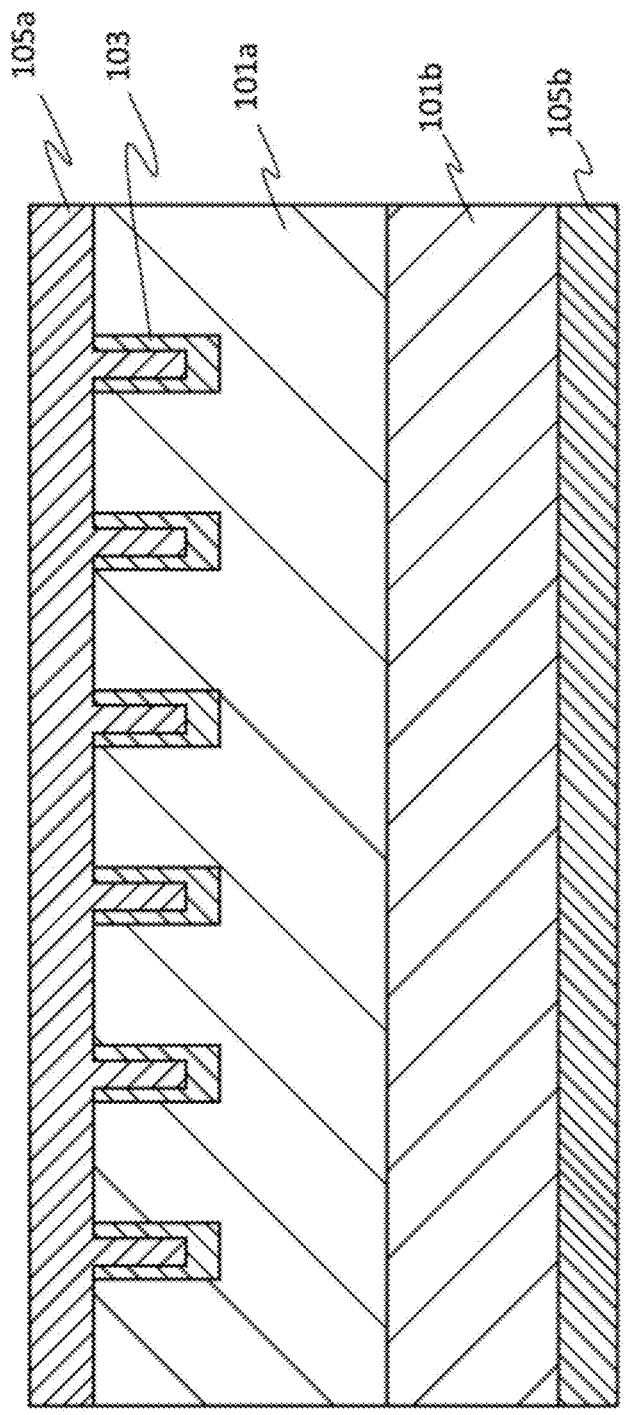
FIG. 3 is a diagram schematically illustrating still another preferred example of the Schottky barrier diode (SBD) of the present invention.

FIG. 3 illustrates still another SBD example of a Schottky barrier diode (SBD) according to the present invention. The SBD in FIG. 3 is greatly different from the configuration of the SBDs in FIGS. 1 and 2 in the points of having a trench structure and including a semi-insulating layer 103. The SBD in FIG. 3 is provided with an n− type semiconductor layer 101a, an n+ type semiconductor layer 101b, a Schottky electrode 105a, an ohmic electrode 105b, and the semi-insulating layer 103. This SBD is capable of great reduction in leakage current and great reduction in on resistance while maintaining the withstand voltage.

The semi-insulating layer 103 may be configured with a semi-insulator. Examples of the semi-insulator include those containing a semi-insulator dopant, such as magnesium (Mg), ruthenium (Ru), iron (Fe), beryllium (Be), cesium (Cs), strontium, and barium, those undoped, or the like.
(MESFET)

Figure 4:
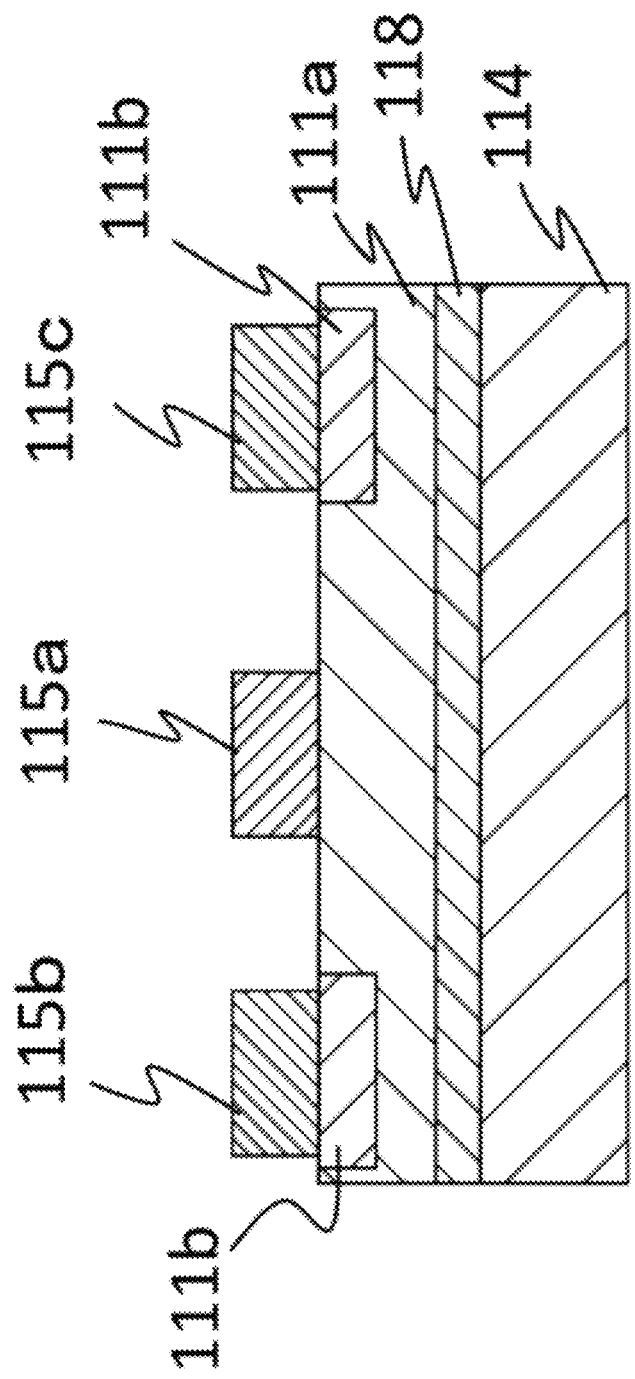
FIG. 4 is a diagram schematically illustrating a preferred example of a metal semiconductor field effect transistor (MESFET) of the present invention.

FIG. 4 illustrates an example of a metal semiconductor field effect transistor (MESFET) according to the present invention. The MESFET in FIG. 4 is provided with an n− type semiconductor layer 111a, an n+ type semiconductor layer 111b, a buffer layer 118, a semi-insulating layer 114, a gate electrode 115a, a source electrode 115b, and a drain electrode 115c.

Materials for the gate electrode, the drain electrode, and the source electrode may be known electrode materials. Examples of the electrode materials include metal, such as Al, Mo, Co, Zr, Sn, Nb, Fe, Cr, Ta, Ti, Au, Pt, V, Mn, Ni, Cu, Hf, W, Ir, Zn, In, Pd, Nd, and Ag, and alloys thereof, metal oxide conductive films, such as tin oxide, zinc oxide, indium oxide, indium tin oxide (ITO), and indium zinc oxide (IZO), organic conductive compounds, such as polyaniline, polythiophene, and polypyrrole, and mixtures thereof, or the like. The gate electrode, the drain electrode, and the source electrode may be formed by known means, such as vacuum deposition and sputtering, for example.

The semi-insulating layer 114 may be configured with a semi-insulator. Examples of the semi-insulator include those containing a semi-insulator dopant, such as magnesium (Mg), ruthenium (Ru), iron (Fe), beryllium (Be), cesium (Cs), strontium, and barium, those undoped, or the like.

In the MESFET in FIG. 4, a good depletion layer is formed under the gate electrode, and the current flowing from the drain electrode to the source electrode is thus efficiently controlled.
(HEMT)

Figure 5:
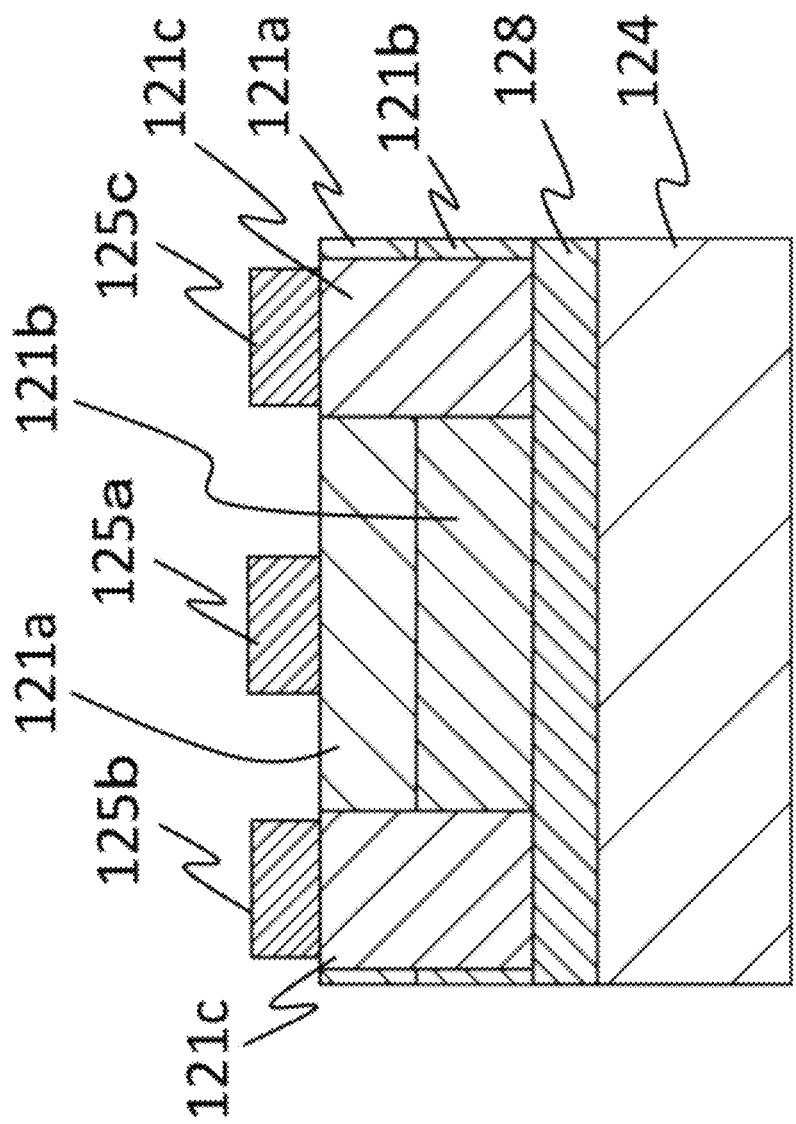
FIG. 5 is a diagram schematically illustrating a preferred example of a high electron mobility transistor (HEMT) of the present invention.

FIG. 5 illustrates an example of a high electron mobility transistor (HEMT) according to the present invention. The HEMT in FIG. 5 is provided with an n type semiconductor layer 121a with a wide band gap, an n type semiconductor layer 121b with a narrow band gap, an n+ type semiconductor layer 121c, a semi-insulating layer 124, a buffer layer 128, a gate electrode 125a, a source electrode 125b, and a drain electrode 125c.

Materials for the gate electrode, the drain electrode, and the source electrode may be respective known electrode materials. Examples of the electrode materials include metal, such as Al, Mo, Co, Zr, Sn, Nb, Fe, Cr, Ta, Ti, Au, Pt, V, Mn, Ni, Cu, Hf, W, Ir, Zn, In, Pd, Nd, and Ag, and alloys thereof, metal oxide conductive films, such as tin oxide, zinc oxide, indium oxide, indium tin oxide (ITO), and indium zinc oxide (IZO), organic conductive compounds, such as polyaniline, polythiophene, and polypyrrole, and mixtures thereof, or the like. The gate electrode, the drain electrode, and the source electrode may be formed by known means, such as vacuum deposition and sputtering, for example.

The n type semiconductor layers under the gate electrode are configured at least with the layer 121a with a wide band gap and the layer 121b with a narrow band gap and the semi-insulating layer 124 is configured with a semi-insulator. Examples of the semi-insulator include those containing a semi-insulator dopant, such as ruthenium (Ru) and iron (Fe), those undoped, or the like.

In the HEMT in FIG. 5, a good depletion layer is formed under the gate electrode, and the current flowing from the drain electrode to the source electrode is thus efficiently controlled. Further, in the present invention, formation of a recess structure enables normally-off characteristics.
(MOSFET)

Figure 6:
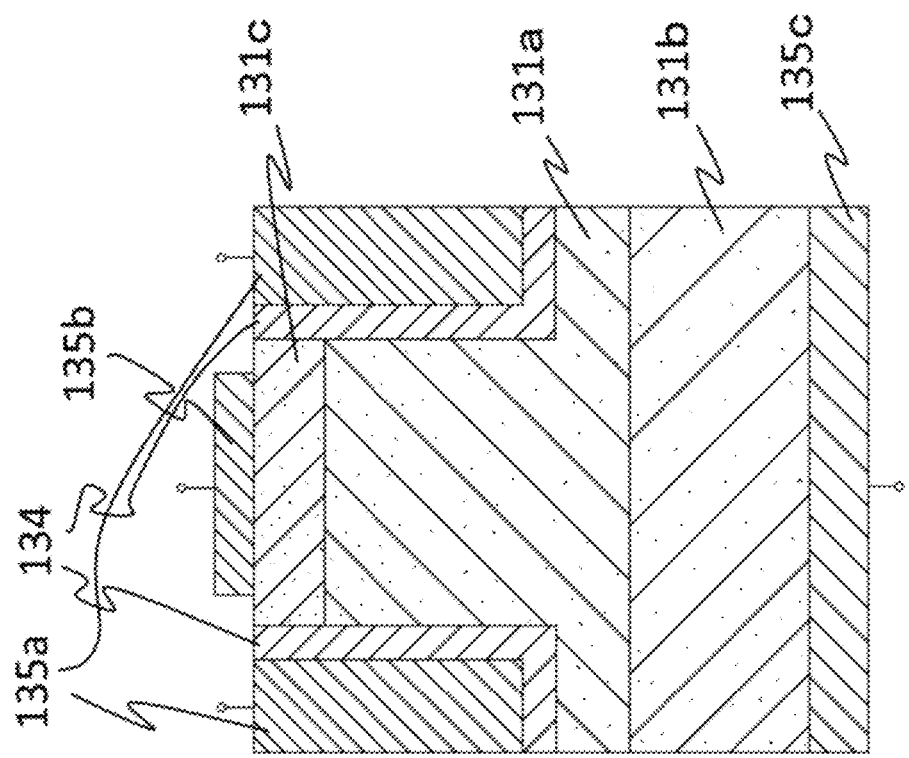
FIG. 6 is a diagram schematically illustrating a preferred example of a metal oxide semiconductor field effect transistor (MOSFET) of the present invention.

FIG. 6 illustrates an example of a MOSFET as the semiconductor device of the present invention. The MOSFET in FIG. 6 is a trench MOSFET and provided with an n− type semiconductor layer 131a, n+ type semiconductor layers 131b and 131c, a gate insulating film 134, a gate electrode 135a, a source electrode 135b, and a drain electrode 135c.

On the drain electrode 135c, the n+ type semiconductor layer 131b having a thickness, for example, from 100 nm to 100 μm is formed. On the n+ type semiconductor layer 131b, the n− type semiconductor layer 131a having a thickness, for example, from 100 nm to 100 μm is formed. Further, on the n− type semiconductor layer 131a, the n+ type semiconductor layer 131c is formed. On the n+ type semiconductor layer 131c, the source electrode 135b is formed.

In the n− type semiconductor layer 131a and the n+ type semiconductor layer 131c, a plurality of trench grooves are formed that has a depth reaching at some point of the n− type semiconductor layer 131a penetrating through the n+ semiconductor layer 131c. The gate electrode 135a is formed embedded in the trench grooves via the gate insulating film 134 having a thickness, for example, from 10 nm to 1 μm.

In an on state of the MOSFET in FIG. 6, when a voltage is applied between the source electrode 135b and the drain electrode 135c to give a voltage, positive to the source electrode 135b, to the gate electrode 135a, channel layers are formed on the sides of the n− type semiconductor layer 131a and the electrons are injected into the n− type semiconductor layer 131a to be turned on. In an off state, the voltage of the gate electrode is made 0 V, thereby no longer producing the channel layers. The n− type semiconductor layer 131a is then filled with a depletion layer to be turned off.

Figure 7A:
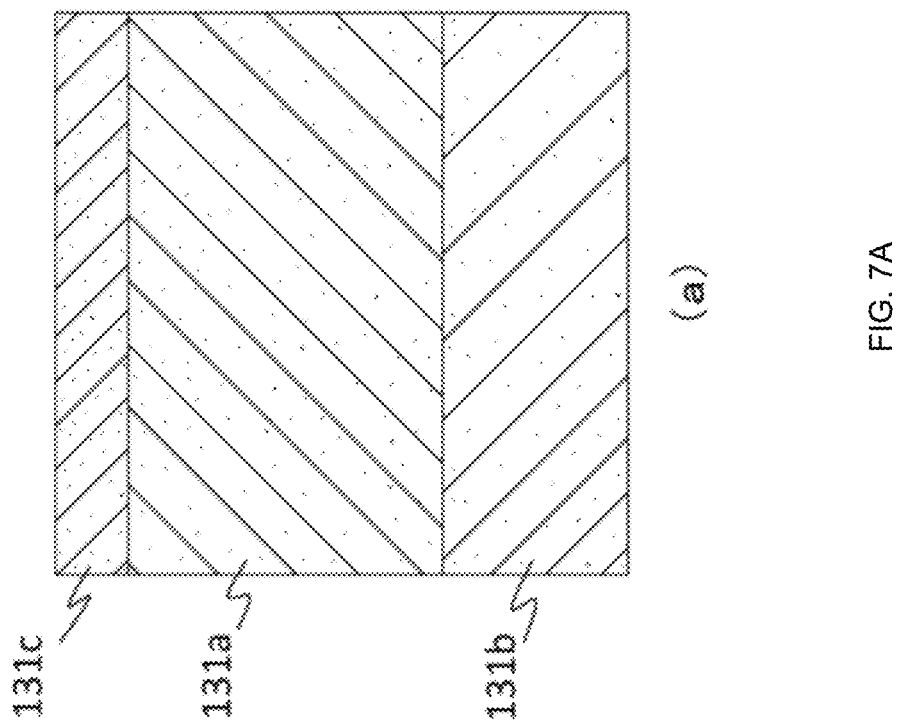
FIGS. 7A to 7C show schematic views to illustrate part of a procedure of manufacturing the metal oxide semiconductor field effect transistor (MOSFET) in FIG. 6.
Figure 7B:
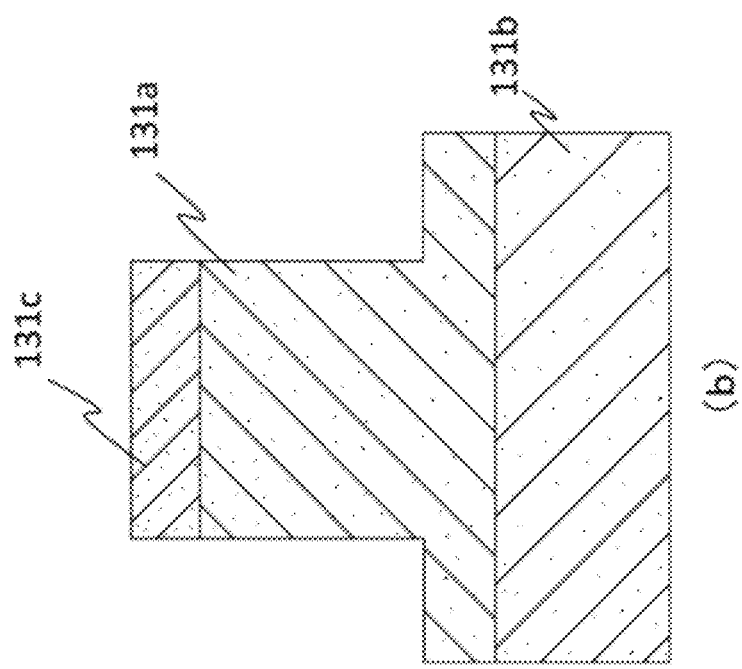
Figure 7C:
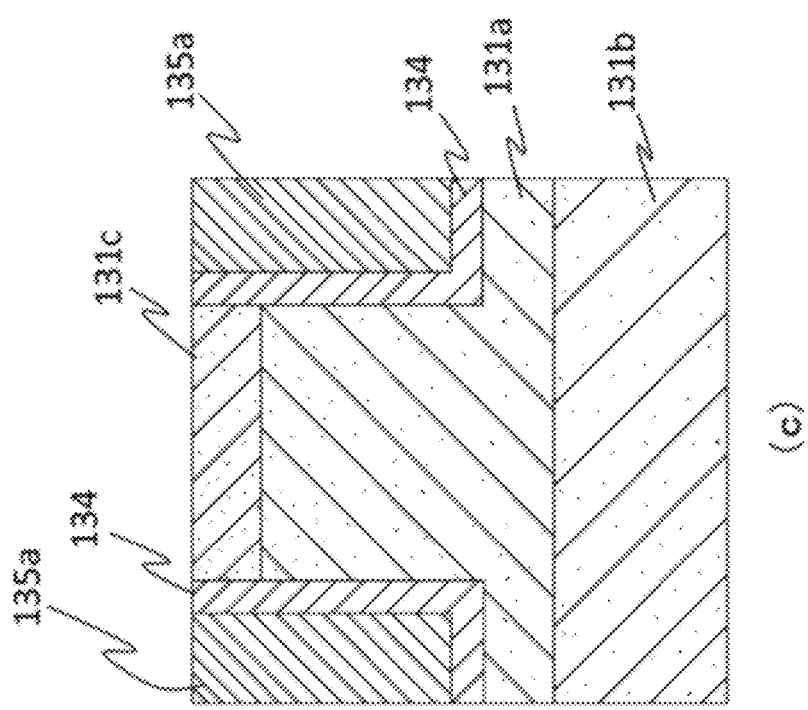

FIGS. 7A to 7C illustrate part of a procedure of manufacturing the MOSFET in FIG. 6. For example, using a semiconductor structure as illustrated in FIG. 7A, an etching mask is provided in a predetermined region of the n− type semiconductor layer 131a and the n+ type semiconductor layer 131c. Using the etching mask as a mask, anisotropic etching is further performed by reactive ion etching or the like to form, as illustrated in FIG. 7B, trench grooves with a depth from the surface of the n+ type semiconductor layer 131c to some point of the n– type semiconductor layer 131a. Then, as illustrated in FIG. 7C, the gate insulating film 134 with a thickness, for example, from 50 nm to 1 μm is formed on the sides and the bottom of the trench grooves using known means, such as thermal oxidation, vacuum deposition, sputtering, and CVD. Then, using CVD, vacuum deposition, sputtering, or the like, a gate electrode material, such as polysilicon, for example, is formed on the trench grooves with a thickness equal to or less than that of the n– type semiconductor layer 131a.

Then, using known means, such as vacuum deposition, sputtering, and CVD, the source electrode 135b is formed on the n+ type semiconductor layer 131c and the drain electrode 135c is formed on the n+ type semiconductor layer 131b to manufacture a power MOSFET. Electrode materials for the source electrode and the drain electrode may be respective known electrode materials, and examples of the electrode materials include metal, such as Al, Mo, Co, Zr, Sn, Nb, Fe, Cr, Ta, Ti, Au, Pt, V, Mn, Ni, Cu, Hf, W, Ir, Zn, In, Pd, Nd, and Ag, and alloys thereof, metal oxide conductive films, such as tin oxide, zinc oxide, indium oxide, indium tin oxide (ITO), and indium zinc oxide (IZO), organic conductive compounds, such as polyaniline, polythiophene, and polypyrrole, and mixtures thereof, or the like.

Figure 8:
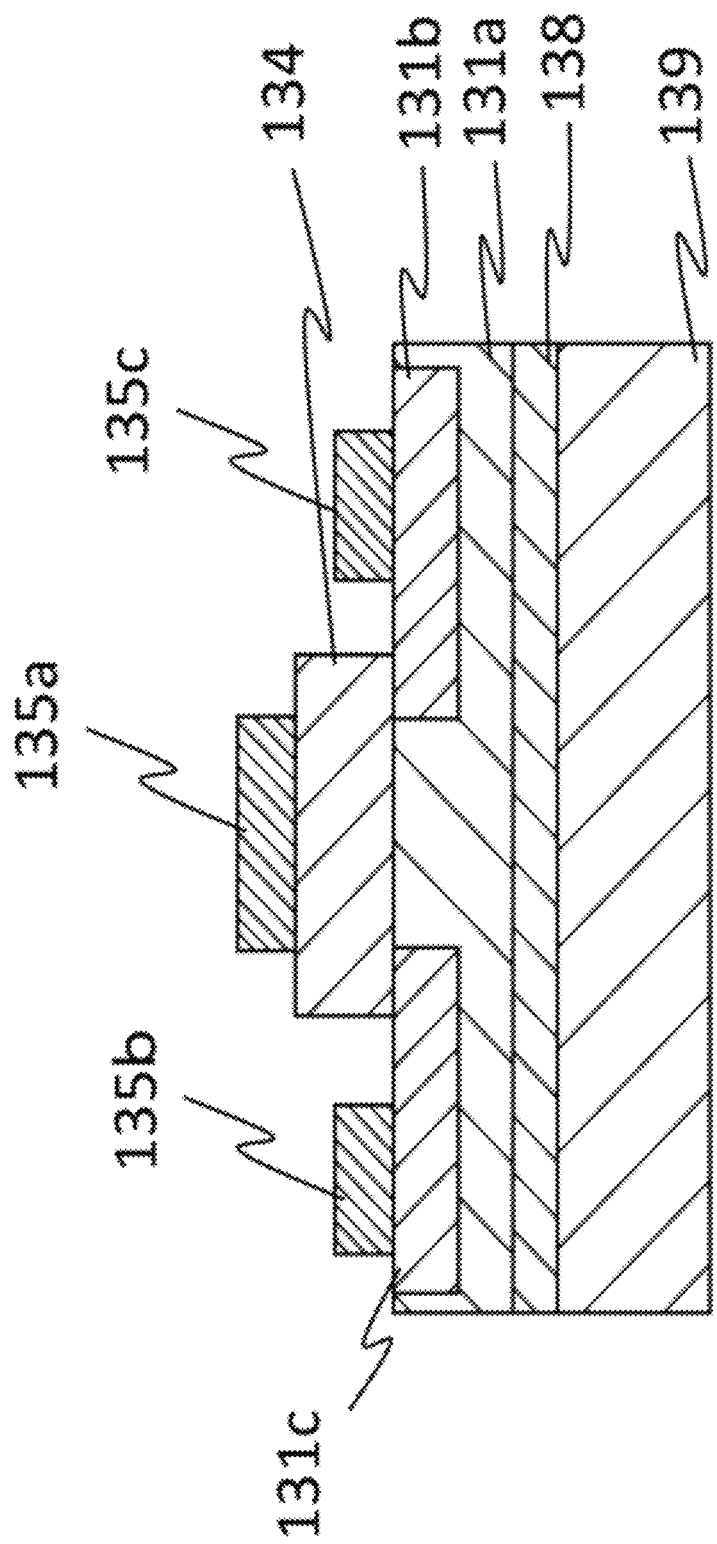
FIG. 8 is a diagram schematically illustrating another example of the metal oxide semiconductor field effect transistor (MOSFET) of the present invention.

The MOSFET thus obtained is even more excellent in withstand voltage compared with conventional trench MOSFETs. Although FIG. 6 illustrates the example of the trench vertical MOSFET, the present invention is not limited to this and is applicable to various forms of MOSFET. For example, the trench grooves in FIG. 6 may be formed deeper down to the bottom of the n– type semiconductor layer 131a to reduce series resistance. FIG. 8 illustrates an example of a lateral MOSFET. The MOSFET in FIG. 8 is provided with an n– type semiconductor layer 131a, a first n+ type semiconductor layer 131b, a second n+ type semiconductor layer 131c, a gate insulating film 134, a gate electrode 135a, a source electrode 135b, a drain electrode 135c, a buffer layer 138, and a semi-insulating layer 139. As illustrated in FIG. 8, the n+ type semiconductor layers are embedded in the n– type semiconductor layer to enable better flow of a current compared with that in other lateral MOSFETs.

(SIT)

Figure 9:
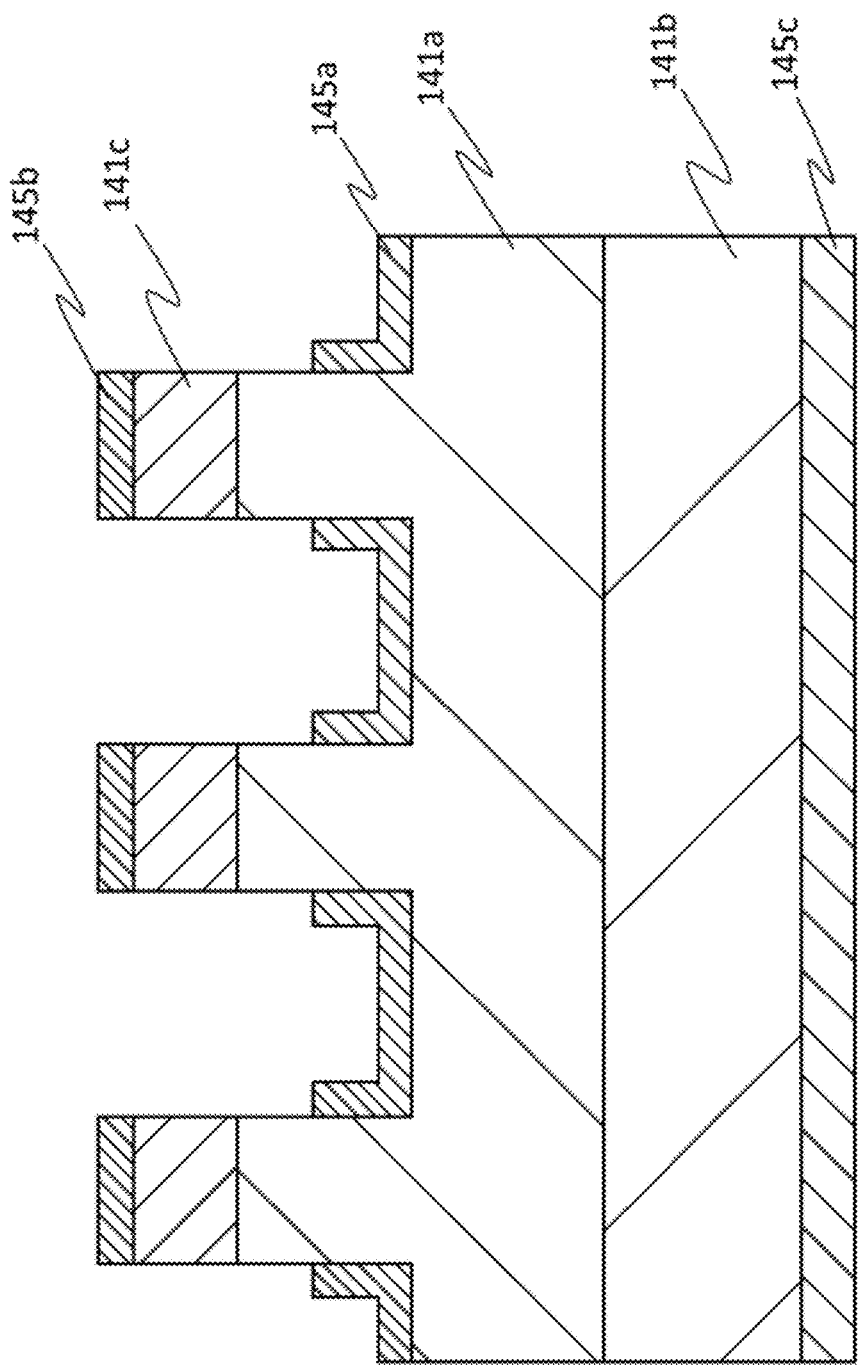
FIG. 9 is a diagram schematically illustrating a preferred example of a static induction transistor (SIT) of the present invention.

FIG. 9 illustrates an example of an SIT as the semiconductor device of the present invention. The SIT in FIG. 9 is provided with an n– type semiconductor layer 141a, n+ type semiconductor layers 141b and 141c, gate electrodes 145a, source electrodes 145b, and a drain electrode 145c.

On the drain electrode 145c, the n+ type semiconductor layer 141b having a thickness, for example, from 100 nm to 100 μm is formed. On the n+ type semiconductor layer 141b, the n– type semiconductor layer 141a having a thickness, for example, from 100 nm to 100 μm is formed. Further, on the n– type semiconductor layer 141a, the n+ type semiconductor layer 141c is formed. On the n+ type semiconductor layer 141c, the source electrodes 145b are formed.

In the n– type semiconductor layer 141a, a plurality of trench grooves are formed that has a depth reaching at some point of the n–semiconductor layer 141a penetrating through the n+ semiconductor layer 141c. On the n– type semiconductor layer in the trench grooves, the gate electrodes 145a are formed.

In an on state of the SIT in FIG. 9, when a voltage is applied between the source electrodes 145b and the drain electrode 145c to give a voltage, positive to the source electrodes 145b, to the gate electrodes 145a, a channel layer is formed in the n– type semiconductor layer 141a and the electrons are injected into the n– type semiconductor layer 141a to be turned on. In an off state, the voltage of the gate electrodes is made 0 V, thereby no longer producing the channel layer. The n– type semiconductor layer 141a is then filled with a depletion layer to be turned off.

The SIT illustrated in FIG. 9 may be manufactured by known means. For example, using the semiconductor structure illustrated in FIG. 7A, in the same manner as the procedure of manufacturing an MOSFET in FIGS. 7A to 7C above, an etching mask is provided in a predetermined region of the n– type semiconductor layer 141a and the n+ type semiconductor layer 141c. Using the etching mask as a mask, anisotropic etching is performed by, for example, reactive ion etching or the like to form trench grooves with a depth from the surface of the n+ type semiconductor layer 141c to some point of the n– type semiconductor layer. Then, by CVD, vacuum deposition, sputtering, or the like, a gate electrode material, such as polysilicon, for example, is formed on the trench grooves with a thickness equal to or less than that of the n– type semiconductor layer 141a. Then, using known means, such as vacuum deposition, sputtering, and CVD, the source electrodes 145b are formed on the n+ type semiconductor layer 141c and the drain electrode 145c is formed on the n+ type semiconductor layer 141b to manufacture the SIT illustrated in FIG. 9.

Electrode materials for the source electrodes and the drain electrode may be respective known electrode materials, and examples of the electrode materials include metal, such as Al, Mo, Co, Zr, Sn, Nb, Fe, Cr, Ta, Ti, Au, Pt, V, Mn, Ni, Cu, Hf, W, Ir, Zn, In, Pd, Nd, and Ag, and alloys thereof, metal oxide conductive films, such as tin oxide, zinc oxide, indium oxide, indium tin oxide (ITO), and indium zinc oxide (IZO), organic conductive compounds, such as polyaniline, polythiophene, and polypyrrole, and mixtures thereof, or the like.

Although a p type semiconductor is not used in the above example, the present invention is not limited to such an example and a p type semiconductor may be used. FIGS. 10 to 16 illustrate examples of using a p type semiconductor. These semiconductor devices may be manufactured in the manner same as that in the above examples. The p type semiconductor may be of the same material as that for the n type semiconductor but containing a p type dopant, or may be different from that.

Figure 10:
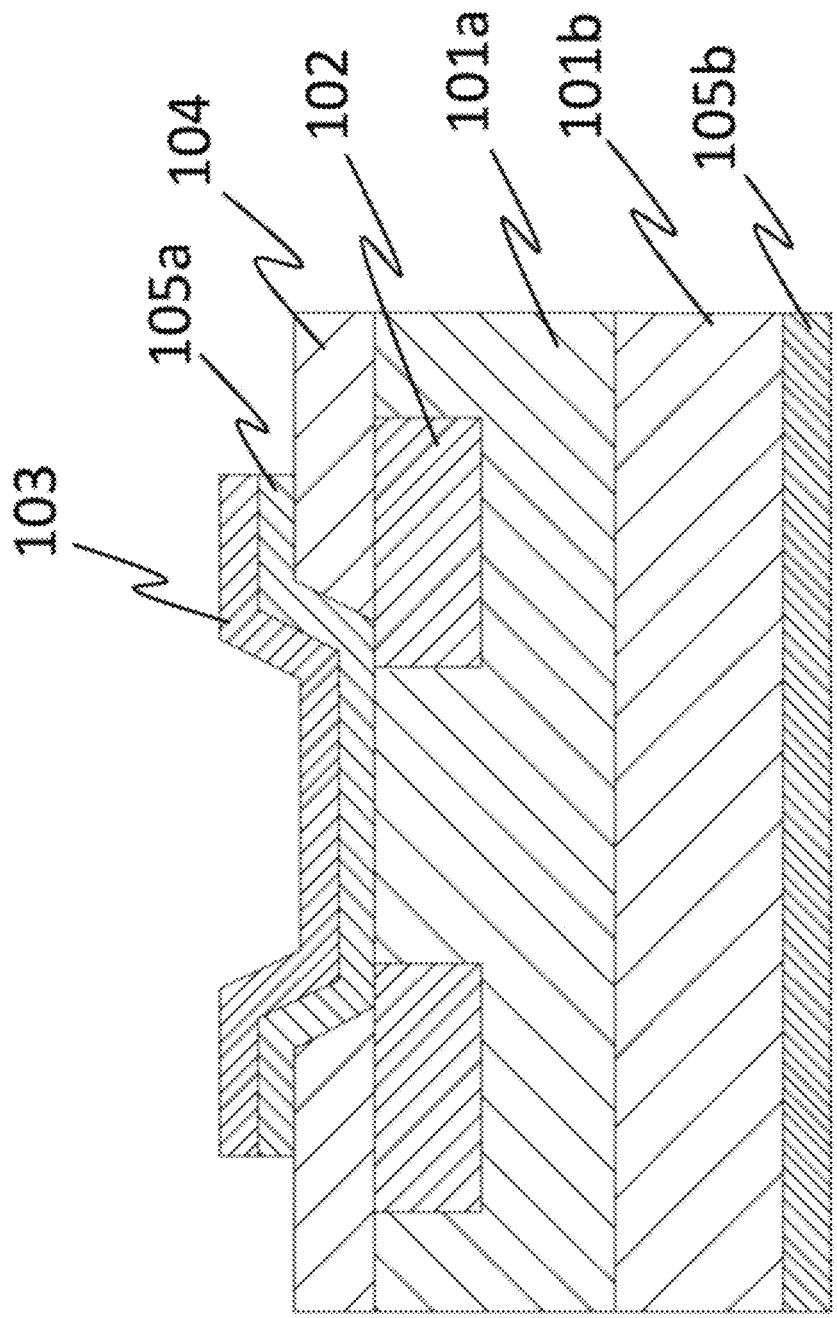
FIG. 10 is a diagram schematically illustrating still another preferred example of the Schottky barrier diode (SBD) of the present invention.

FIG. 10 illustrates a preferred example of a Schottky barrier diode (SBD) provided with an n– type semiconductor layer 101a, an n+ type semiconductor layer 101b, a p type semiconductor layer 102, an insulating layer 104, a Schottky electrode 105a, and an ohmic electrode 105b.

Figure 11:
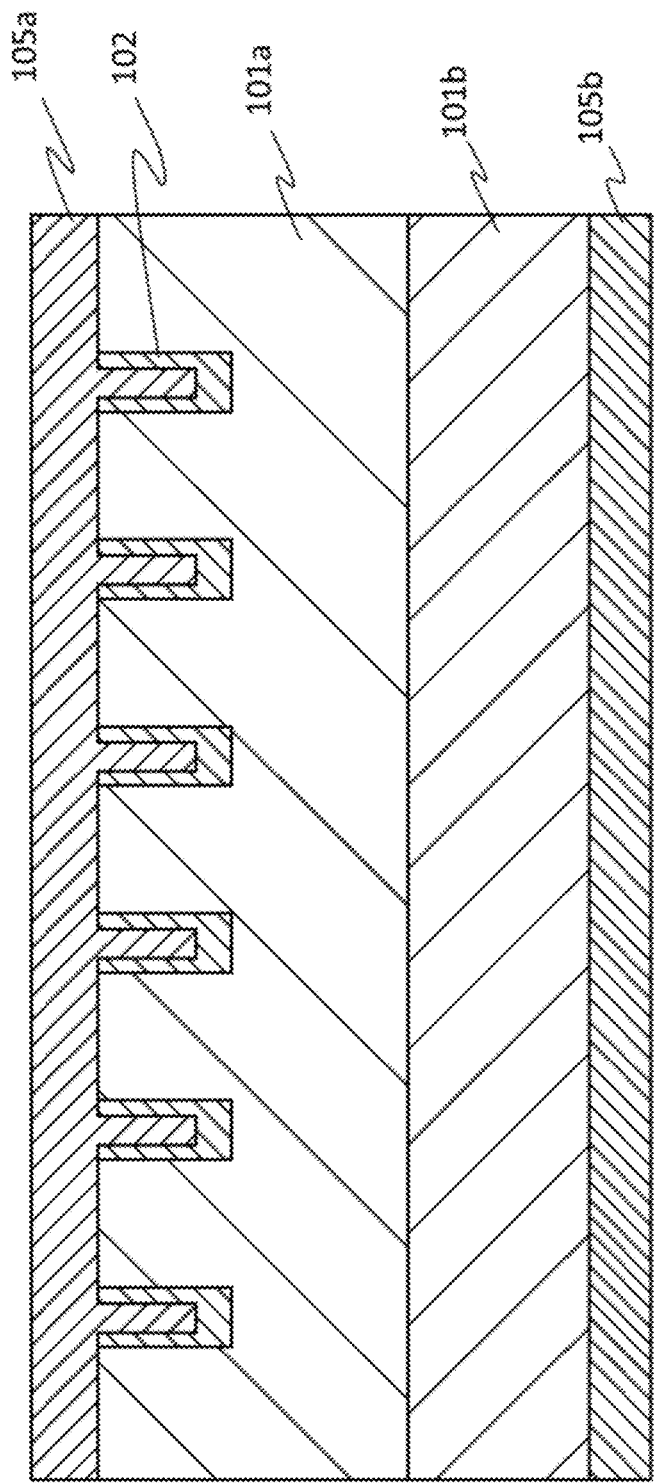
FIG. 11 is a diagram schematically illustrating still another preferred example of the Schottky barrier diode (SBD) of the present invention.

FIG. 11 illustrates a preferred example of a trench Schottky barrier diode (SBD) provided with an n– type semiconductor layer 101a, an n+ type semiconductor layer 101b, a p type semiconductor layer 102, a Schottky electrode 105a, and an ohmic electrode 105b. Such a trench SBD enables great reduction in the leakage current and great reduction in the on resistance while maintaining the withstand voltage.

Figure 12:
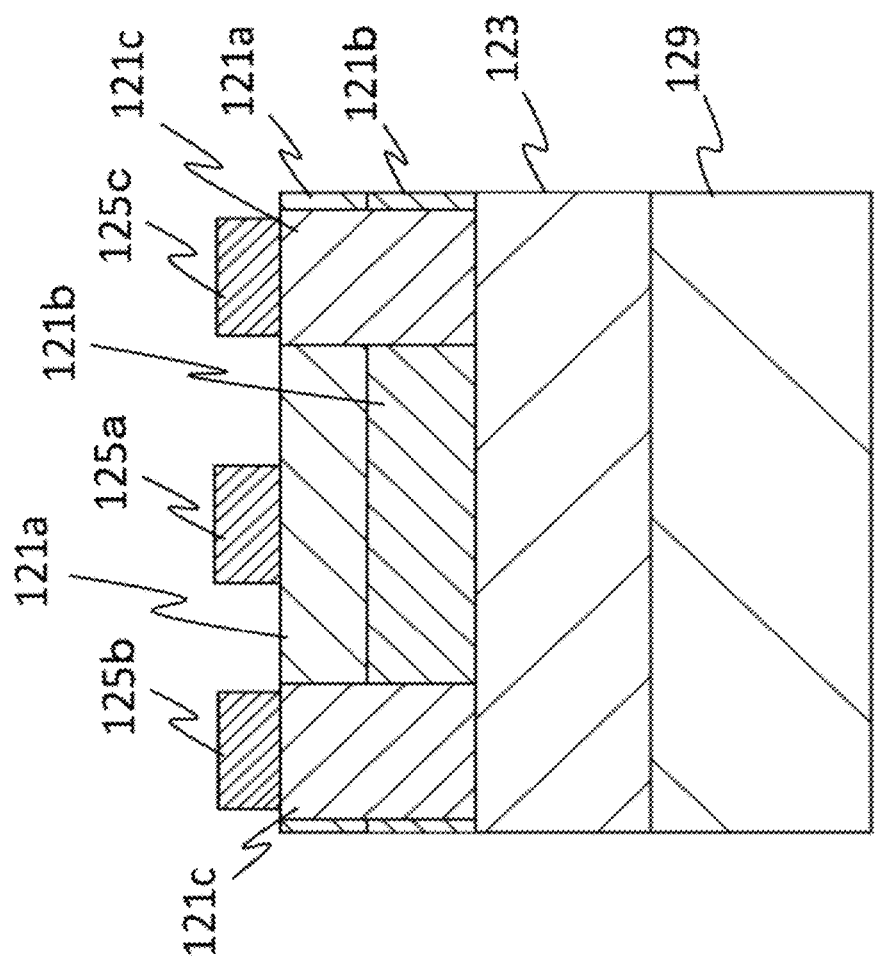
FIG. 12 is a diagram schematically illustrating another preferred example of the high electron mobility transistor (HEMT) of the present invention.

FIG. 12 illustrates a preferred example of a high electron mobility transistor (HEMT) provided with an n type semiconductor layer 121a with a wide band gap, an n type semiconductor layer 121b with a narrow band gap, an n+ type semiconductor layer 121c, a p type semiconductor layer 123, a gate electrode 125a, a source electrode 125b, a drain electrode 125c, and a substrate 129.

Figure 13:
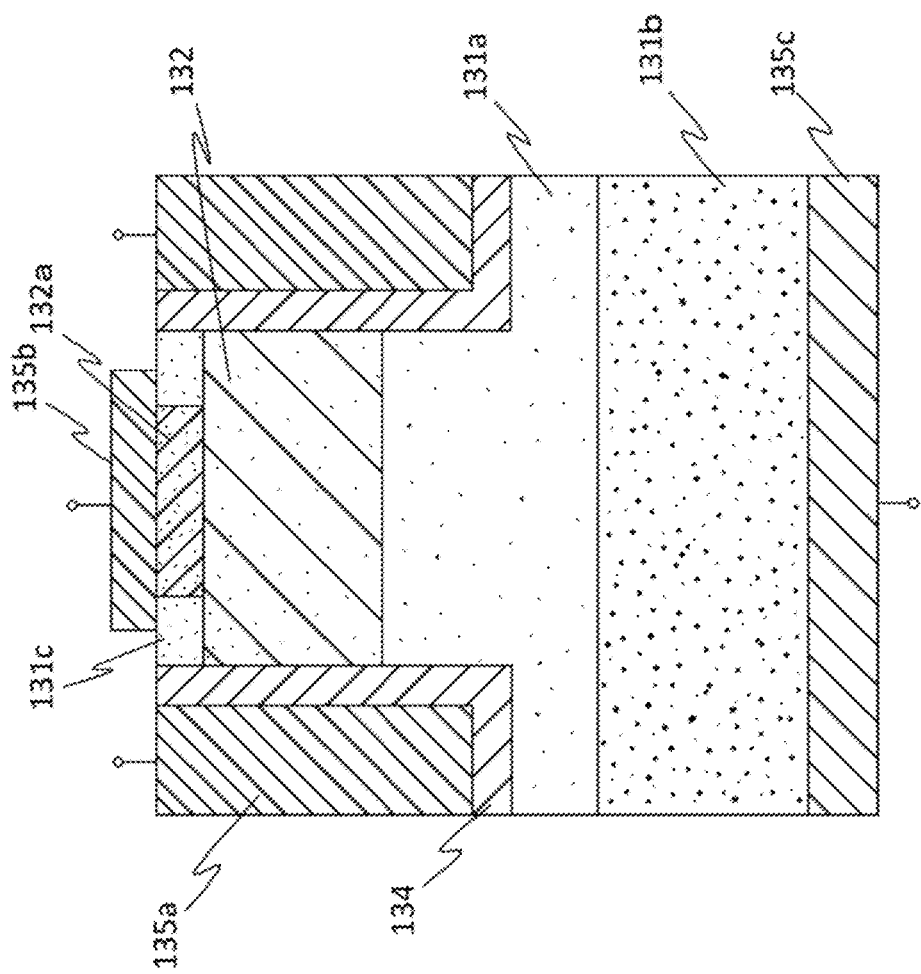
FIG. 13 is a diagram schematically illustrating still another preferred example of the metal oxide semiconductor field effect transistor (MOSFET) of the present invention.

FIG. 13 illustrates a preferred example of a metal oxide semiconductor field effect transistor (MOSFET) provided with an n– type semiconductor layer 131a, a first n+ type semiconductor layer 131b, a second n+ type semiconductor layer 131c, a p type semiconductor layer 132, a p+ type semiconductor layer 132a, a gate insulating film 134, a gate electrode 135a, a source electrode 135b, and a drain electrode 135c. The p+ type semiconductor layer 132a may be a p type semiconductor layer and may be same as the p type semiconductor layer 132.

Figure 14:
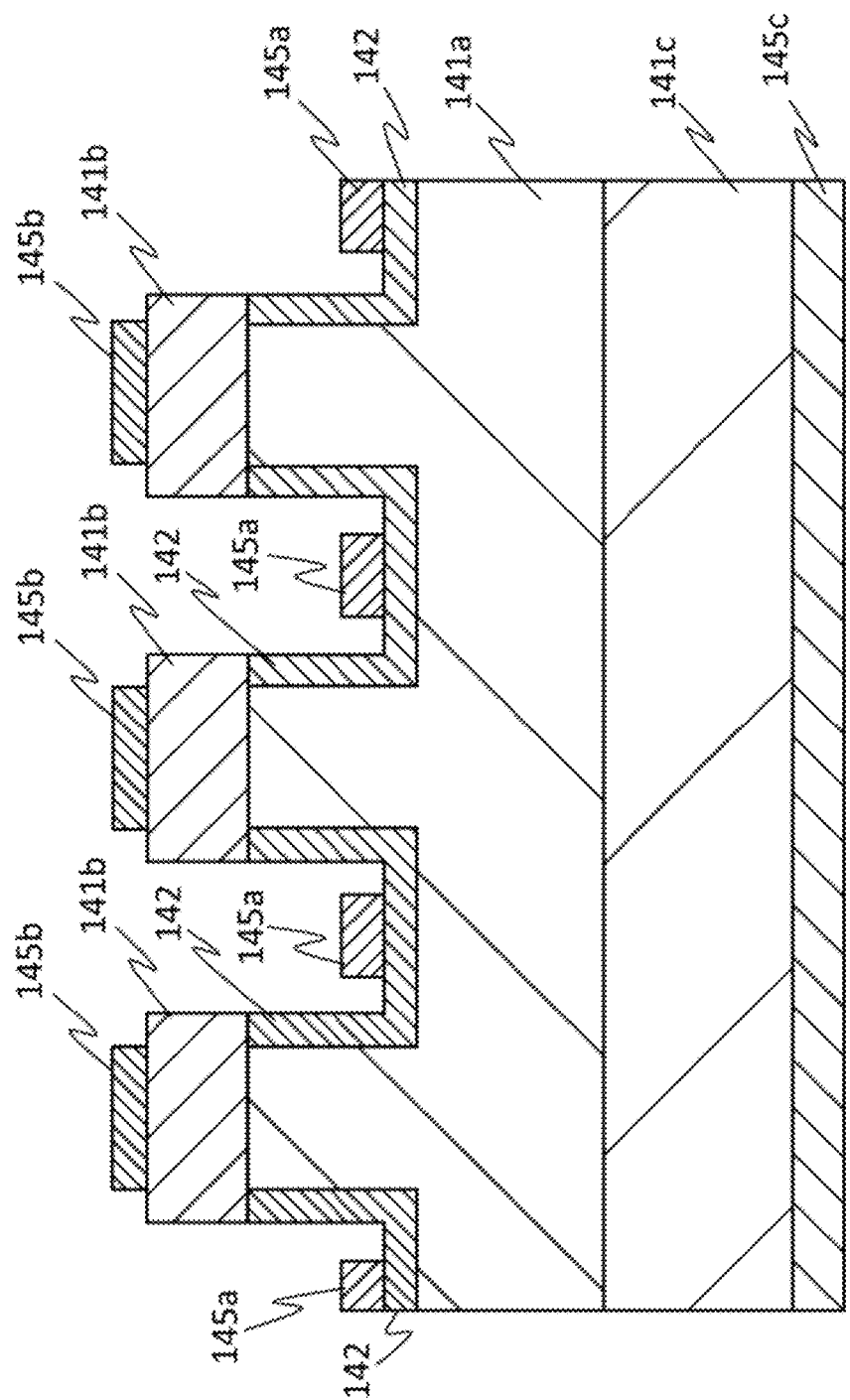
FIG. 14 is a diagram schematically illustrating a preferred example of a junction field effect transistor (JFET) of the present invention.

FIG. 14 illustrates a preferred example of a junction field effect transistor (JFET) provided with an n− type semiconductor layer 141a, a first n+ type semiconductor layer 141b, a second n+ type semiconductor layer 141c, a p type semiconductor layer 142, gate electrodes 145a, source electrodes 145b, and the drain electrode 145c.

Figure 15:
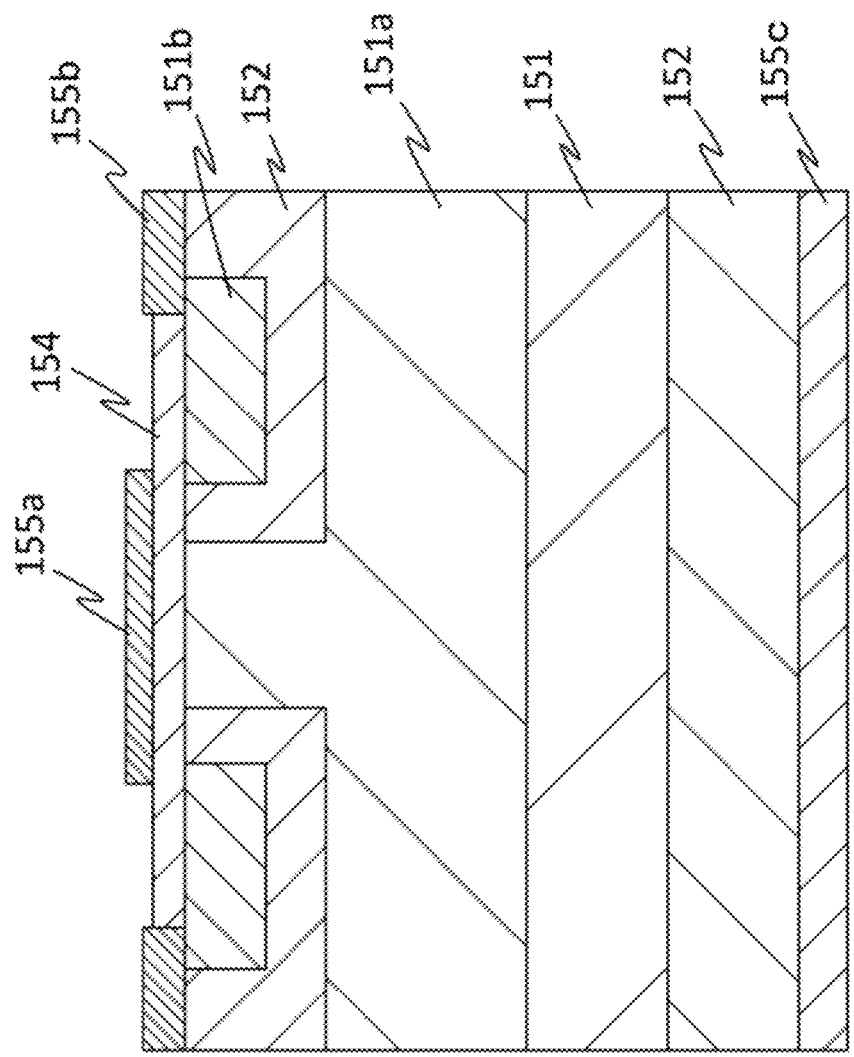
FIG. 15 is a diagram schematically illustrating a preferred example of an insulated gate bipolar transistor (IGBT) of the present invention.

FIG. 15 illustrates a preferred example of an insulated gate bipolar transistor (IGBT) provided with an n type semiconductor layer 151, an n− type semiconductor layer 151a, an n+ type semiconductor layer 151b, a p type semiconductor layer 152, a gate insulating film 154, a gate electrode 155a, emitter electrodes 155b, and a collector electrode 155c.

(LED)

Figure 16:
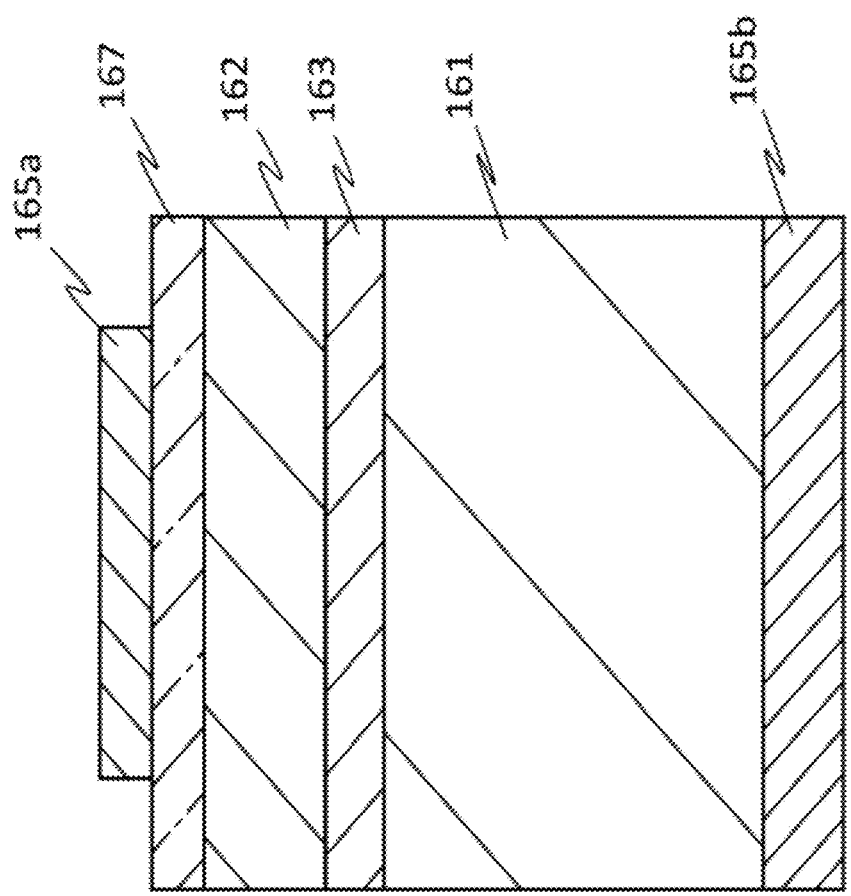
FIG. 16 is a diagram schematically illustrating a preferred example of a light emitting device (LED) of the present invention.

FIG. 16 illustrates an example of a light emitting diode (LED) as the semiconductor device of the present invention. The semiconductor light emitting device in FIG. 16 is provided with an n type semiconductor layer 161 on a second electrode 165b, and on the n type semiconductor layer 161, a light emitting layer 163 is laminated. Then, on the light emitting layer 163, a p type semiconductor layer 162 is laminated. On the p type semiconductor layer 162, a translucent electrode 167 is provided that transmits light produced by the light emitting layer 163. On the translucent electrode 167, a first electrode 165a is laminated. The semiconductor light emitting device in FIG. 16 may be covered with a protective layer except for the electrode portions.

Examples of the material for the translucent electrode include conductive materials of oxide containing indium (In) or titanium (Ti) or the like. More specific examples include $In_2O_3$, ZnO, $SnO_2$, $Ga_2O_3$, $TiO_2$, and $CeO_2$, mixed crystal of two or more of them, those doped by them, or the like. Such a material is provided by known means, such as sputtering, to form a translucent electrode. After forming the translucent electrode, thermal annealing may be applied to make the translucent electrode transparent.

According to the semiconductor light emitting device in FIG. 16, where the first electrode 165a is a cathode and the second electrode 165b is an anode, a flow of current via both of them to the p type semiconductor layer 162, the light emitting layer 163, and the n type semiconductor layer 161 causes the light emitting layer 163 to emit light.

Examples of the materials for the first electrode 165a and the second electrode 165b include metal, such as Al, Mo, Co, Zr, Sn, Nb, Fe, Cr, Ta, Ti, Au, Pt, V, Mn, Ni, Cu, Hf, W, Ir, Zn, In, Pd, Nd, and Ag, and alloys thereof, metal oxide conductive films, such as tin oxide, zinc oxide, indium oxide, indium tin oxide (ITO), and indium zinc oxide (IZO), organic conductive compounds, such as polyaniline, polythiophene, and polypyrrole, and mixtures thereof, or the like. A method of forming the electrodes is not particularly limited. The electrodes may be formed on the substrate in accordance with a method appropriately selected by considering suitability for the above material from printing process, wet process such as spraying and coating, physical process such as vacuum deposition, sputtering, and ion plating, chemical process such as CVD and plasma CVD, or the like.

Figure 17:
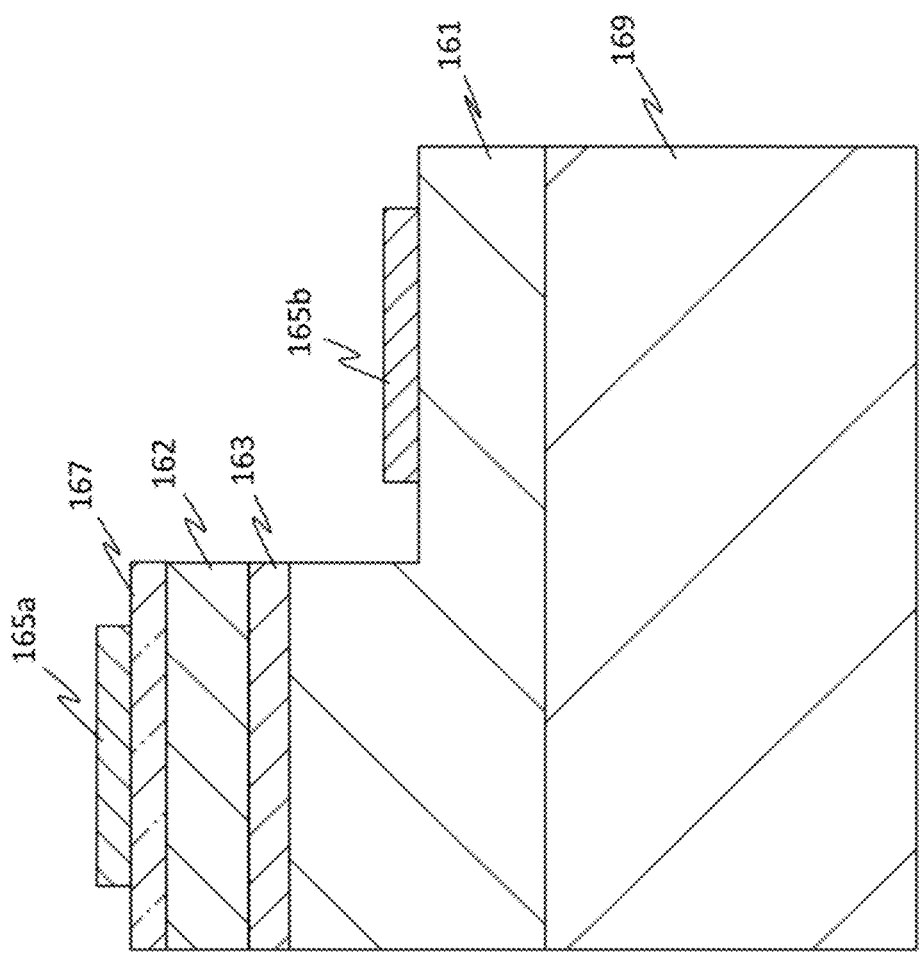
FIG. 17 is a diagram schematically illustrating another preferred example of the light emitting device (LED) of the present invention.

FIG. 17 illustrates another embodiment of a light emitting device. In the light emitting device in FIG. 17, an n type semiconductor layer 161 is laminated on a substrate 169. A p type semiconductor layer 162, a light emitting layer 163, and part of the n type semiconductor layer 161 are notched to expose the n type semiconductor layer 161. On part of the exposed surface of the semiconductor layer, the second electrode 165b is laminated.

EXAMPLE

Examples of the Present Invention are Described Below.

Example 1

1. Film Formation Apparatus

Figure 18:
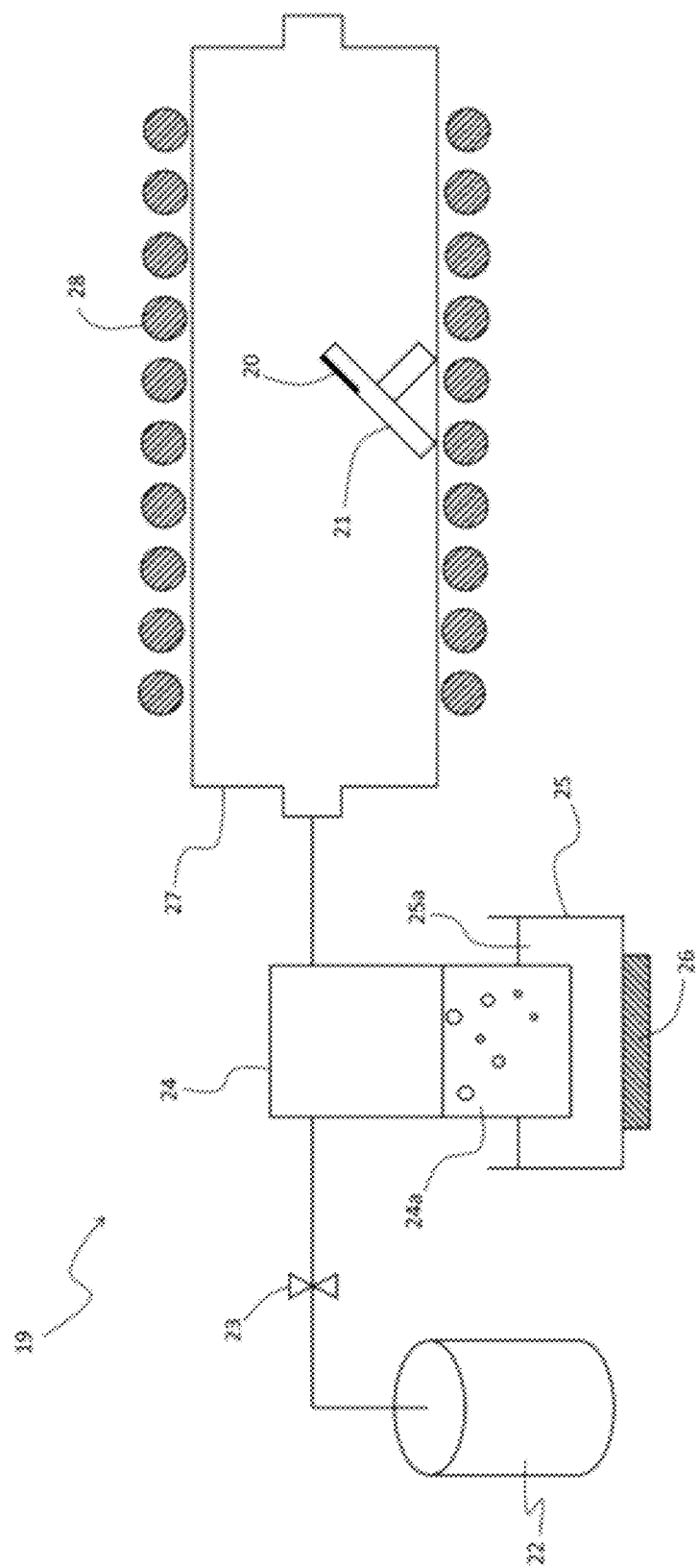
FIG. 18 is a configuration diagram of a mist CVD apparatus used in Examples.

With reference to FIG. 18, a mist CVD apparatus 19 used in the working Examples is described. The mist CVD apparatus 19 was provided with a susceptor 21 to place a substrate 20, carrier gas supply means 22 to supply a carrier gas, a flow regulating valve 23 to regulate a flow rate of the carrier gas discharged from the carrier gas supply means 22, a mist generator 24 to store a raw-material solution 24a, water 25a, an ultrasonic vibration transducer 26 mounted at a bottom of the container 25, a supply pipe 27 of a quartz pipe with an inner diameter of 40 mm, and a heater 28 placed surrounding the supply pipe 27. The susceptor 21 was made from quartz and had a surface to place the substrate 20 inclined from the horizontal plane. Both the supply pipe 27 and the susceptor 21 made from quartz inhibit mixing of impurities derived from the apparatus into the film formed on the substrate 20.

As the susceptor 21, the susceptor 51 illustrated in FIGS. 19A to 19B was used. The susceptor had a tilt angle of 45°, and the susceptor was configured to have a total area of the substrate and the susceptor in the supply pipe that, as illustrated in FIGS. 19A to 19B, gradually increased the susceptor region and gradually decreased the exhaust region. As illustrated in FIG. 20, the susceptor region was configured to be greater than the exhaust region.

2. Preparation of Raw-Material Solution and Crystal Substrate

An aqueous solution of gallium bromide and germanium oxide was prepared at an atomic ratio of germanium to gallium of 1:0.05. At this point, a 48% hydrobromic acid solution was contained at a volume ratio of 10%. In Condition 1, the concentration of germanium oxide was $5.0 \times 10^{-3}$ mol/L. The raw-material solution 24a was stored in the mist generator 24. As the crystal substrate 20, a c-plane sapphire substrate with an off angle of 0.2° (10 mm square with a thickness of 600 μm) was used.

3. Film Formation Preparation

On the susceptor 21, the crystal substrate 20 was placed. The heater 28 was activated to raise a temperature in the supply pipe 27 to 500° C. The flow regulating valve 23 was then opened to supply a carrier gas from the carrier gas source 22 into the supply pipe 27. After the carrier gas sufficiently substituted for the atmosphere in the supply pipe 27, the flow rate of the carrier gas was regulated at 5 L/min. As the carrier gas, an oxygen gas was used.

4. Film Formation

The ultrasonic vibration transducer 26 was then vibrated at 2.4 MHz. The vibration propagated through the water 25a to the raw-material solution 24a, thereby atomizing the raw-material solution 24a to produce raw material fine particles.

The raw material fine particles were introduced to the supply pipe 27 by the carrier gas to be reacted in the supply pipe 27. A film was laminated on the crystal substrate 20 by the CVD reaction on the film formation surface of the crystal substrate 20 to produce a multilayer structure.

5. Evaluation

The crystalline film thus obtained was clean crystal without cloudiness. A phase of the crystalline film thus obtained was identified. The identification was carried out by 2θ/ω scanning at an angle from 15 to 95 degrees using an XRD diffractometer. The measurement was performed using CuK α rays. As a result, the film thus obtained was α-$Ga_2O_3$. The crystalline semiconductor film thus obtained had a film thickness of 3.5 μm.

For evaluation of the electrical characteristics of the film thus obtained, the Hall effect was measured by the van der pauw method. The measurement environment was at room temperature and a frequency of the applied magnetic field at 50 mHz. As a result, the mobility was 2 ($cm^2/V \cdot s$).

Example 2

A multilayer structure was obtained in the same manner as in Example 1 ther than using a c-plane sapphire substrate with an off angle of 0.6° as the crystal substrate.

The crystalline film thus obtained was clean crystal without cloudiness. A phase of the crystalline film thus obtained was identified in the same manner as in Example 1 to find out that the film thus obtained was α-$Ga_2O_3$. The Hall effect was measured in the same manner as in Example lto find out that the mobility was 2 ($cm^2/V \cdot s$).

Example 3

A multilayer structure was obtained in the same manner as in Example 1 other than using a c-plane sapphire substrate with an off angle of 1° as the crystal substrate and changing the film formation temperature to 600° C.

The crystalline film thus obtained was clean crystal without cloudiness. A phase of the crystalline film thus obtained was identified in the same manner as in Example lto find out that the film thus obtained was α-$Ga_2O_3$. The Hall effect was measured in the same manner as in Example 1 to find out that the mobility was 2 ($cm^2/V \cdot s$).

Example 4

A multilayer structure was obtained in the same manner as in Example 1 other than using a c-plane sapphire substrate having an off angle of 2° as the crystal substrate and changing the film formation temperature to 600° C.

The crystalline film thus obtained was clean crystal without cloudiness. A phase of the crystalline film thus obtained was identified in the same manner as in Example 1 to find out that the film thus obtained was α-$Ga_2O_3$. The Hall effect was measured in the same manner as in Example 1 to find out that the mobility was 4 ($cm^2/V \cdot s$).

Example 5

A multilayer structure was obtained in the same manner as in Example 1 other than using a c-plane sapphire substrate having an off angle of 4° as the crystal substrate and changing the film formation temperature to 600° C.

The crystalline film thus obtained was clean crystal without cloudiness. A phase of the crystalline film thus obtained in the same manner as in Example 1 was identified to find out that the film thus obtained was α-$Ga_2O_3$. The Hall effect was measured in the same manner as in Example 1 to find out that the mobility was 12 ($cm^2/V \cdot s$).

Example 6

A multilayer structure was obtained in the same manner as in Example 1 other than using a c-plane sapphire substrate having an off angle of 5° as the crystal substrate and changing the film formation temperature to 600° C.

The crystalline film thus obtained was clean crystal without cloudiness. A phase of the crystalline film thus obtained was identified in the same manner as in Example 1 to find out that the film thus obtained was α-$Ga_2O_3$. The Hall effect was measured in the same manner as in Example 1 to find out that the mobility was 4 ($cm^2/V \cdot s$).

Example 7

A multilayer structure was obtained in the same manner as in Example 1 other than using a c-plane sapphire substrate having an off angle of 6° as the crystal substrate.

The crystalline film thus obtained was clean crystal without cloudiness. A phase of the crystalline film thus obtained in the same manner as in Example 1 was identified to find out that the film thus obtained was α-$Ga_2O_3$. The Hall effect was measured in the same manner as in Example 1 to find out that the mobility was 4 ($cm^2/V \cdot s$).

Comparative Example 1

A multilayer structure was obtained in the same manner as in Example 1 other than using a c-plane sapphire substrate as the crystal substrate without an off angle and changing the film formation temperature to 600° C.

The crystalline film thus obtained was partially cloudy. However, a phase of the crystalline film thus obtained was identified in the same manner as in Example 1 to find out that the film thus obtained was α-$Ga_2O_3$. The Hall effect was measured in the same manner as in Example 1 to find out that the mobility was unmeasurable.

Comparative Example 2

A multilayer structure was obtained in the same manner as in Example 1 other than using a c-plane sapphire substrate having an off angle of 16° as the crystal substrate and changing the film formation temperature to 600° C.

The crystalline film thus obtained was cloudy. However, a phase of the crystalline film thus obtained was identified in the same manner as in Example 1 to find out that the film thus obtained was α-$Ga_2O_3$. The Hall effect was measured in the same manner as in Example 1 to find out that the mobility was unmeasurable.

Comparative Example 3

A multilayer structure was obtained in the same manner as in Comparative Example 2 other than changing the film formation temperature to 500° C.

The crystalline film thus obtained was cloudy. However, a phase of the crystalline film thus obtained was identified in the same manner as in Example 1 to find out that the film thus obtained was α-$Ga_2O_3$. The Hall effect was measured in the same manner as in Example 1 to find out that the mobility was unmeasurable.

Comparative Example 4

A multilayer structure was obtained in the same manner as in Example 1 other than using a c-plane sapphire substrate having an off angle of 20° as the crystal substrate and changing the film formation temperature to 600° C.

The crystalline film thus obtained was cloudy. However, a phase of the crystalline film thus obtained was identified in the same manner as in Example 1 to find out that the film thus obtained was α-Ga$_2$O$_3$. The Hall effect was measured in the same manner as in Example 1 to find out that the mobility was unmeasurable.

Comparative Example 5

A multilayer structure was obtained in the same manner as in Comparative Example 4 other than changing the film formation temperature to 600° C.

The crystalline film thus obtained was cloudy. However, a phase of the crystalline film thus obtained was identified in the same manner as in Example 1 to find out that the film thus obtained was α-Ga$_2$O$_3$. The Hall effect was measured in the same manner as in Example 1 to find out that the mobility was unmeasurable.

Example 8

Figure 21:
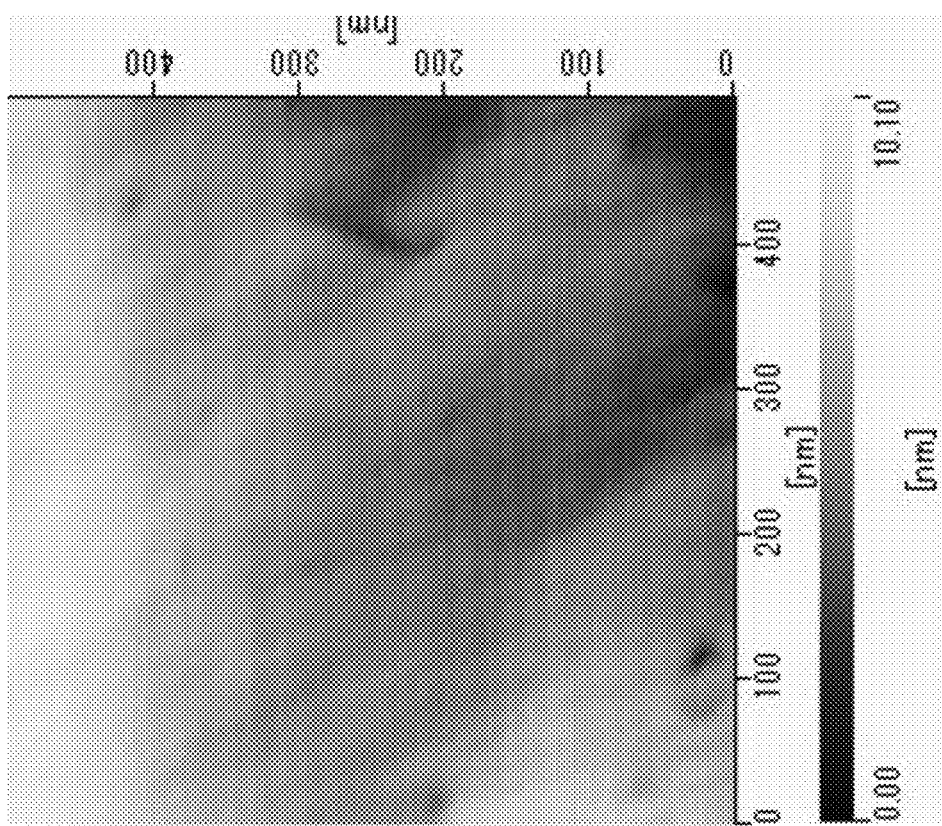
FIG. 21 illustrates an AFM image of a crystalline film in an Example.

A multilayer structure was obtained in the same manner as in Example 5. The crystalline film thus obtained was observed on the surface using AFM. The result of observation is illustrated in FIG. 21 as an AFM image. The center line average roughness was $1.125 \times 10^{-1}$ nm and the maximum difference in elevation (P-V value) was $8.118 \times 10^{-1}$ nm. A multilayer structure was prepared again in the same manner as above to measure the Ra and the PV value on the crystalline film surface using AFM. As a result, the center line average roughness was $1.042 \times 10^{-1}$ nm and the maximum difference in elevation (P-V value) was 1.050 nm. From these results, it was found that the crystalline film of the present invention was excellent in surface smoothness.

Example 9

A multilayer structure was obtained in the same manner as in Example 5 other than using gallium acetylacetonato (0.05 mol/L) instead of gallium bromide, using stannous chloride dihydrate instead of germanium oxide at an atomic ratio of tin to gallium of 1:0.001, using 36% hydrochloric acid instead of the 48% hydrobromic acid solution at a volume ratio of 1.5%, using a nitrogen gas (1.0 L/min.) as a first carrier gas and a nitrogen gas (0.5 L/min.) as a second carrier gas instead of oxygen as the carrier gas, changing the film formation temperature to 500° C., and changing the film formation time to 3 hours. A phase of the crystalline film thus obtained was identified to find out that the film thus obtained was α-Ga$_2$O$_3$. The Hall effect was measured in the same manner as in Example 1 to find out that the mobility was 24 (cm$^2$/V·s).

Example 10

A multilayer structure was obtained in the same manner as in Example 1 other than using an m-plane sapphire substrate with an off angle of 0.4° as the crystal substrate. The crystalline film thus obtained was clean crystal without cloudiness. A phase of the crystalline film thus obtained was identified in the same manner as in Example 1 to find out that the film thus obtained was α-Ga$_2$O$_3$.

Comparative Example 6

A multilayer structure was obtained in the same manner as in Example 10 other than using an m-plane sapphire substrate without an off angle as the crystal substrate. The crystalline film thus obtained was cloudy. However, a phase of the crystalline film thus obtained was identified in the same manner as in Example 1 to find out that the film thus obtained was α-Ga$_2$O$_3$.

Example 11

A multilayer structure was obtained in the same manner as in Example 1 other than using an a-plane sapphire substrate with an off angle of 0.4° as the crystal substrate. The crystalline film thus obtained was clean crystal without cloudiness. A phase of the crystalline film thus obtained was identified in the same manner as in Example 1 to find out that the film thus obtained was α-Ga$_2$O$_3$.

Comparative Example 7

A multilayer structure was obtained in the same manner as in Example 10 other than using an a-plane sapphire substrate without an off angle as the crystal substrate. The crystalline film thus obtained was cloudy. However, a phase of the crystalline film thus obtained was identified in the same manner as in Example 1 to find out that the film thus obtained was α-Ga$_2$O$_3$.

Example 12

A multilayer structure was obtained in the same manner as in Example 1 other than using an r-plane sapphire substrate with an off angle as the crystal substrate. The crystalline film thus obtained was clean crystal without cloudiness. A phase of the crystalline film thus obtained was identified in the same manner as in Example 1 to find out that the film thus obtained was α-Ga$_2$O$_3$.

Comparative Example 8

A multilayer structure was obtained in the same manner as in Example 10 other than using an r-plane sapphire substrate without an off angle as the crystal substrate. The crystalline film thus obtained was cloudy. However, a phase of the crystalline film thus obtained was identified in the same manner as in Example 1 to find out that the film thus obtained was α-Ga$_2$O$_3$.

Example 13

A multilayer structure was obtained in the same manner as in Example 1 other than using a c-plane sapphire substrate having an off angle of 8° as the crystal substrate, changing the film formation temperature to 580° C., and changing the film formation time to 130 minutes.

Figure 22:
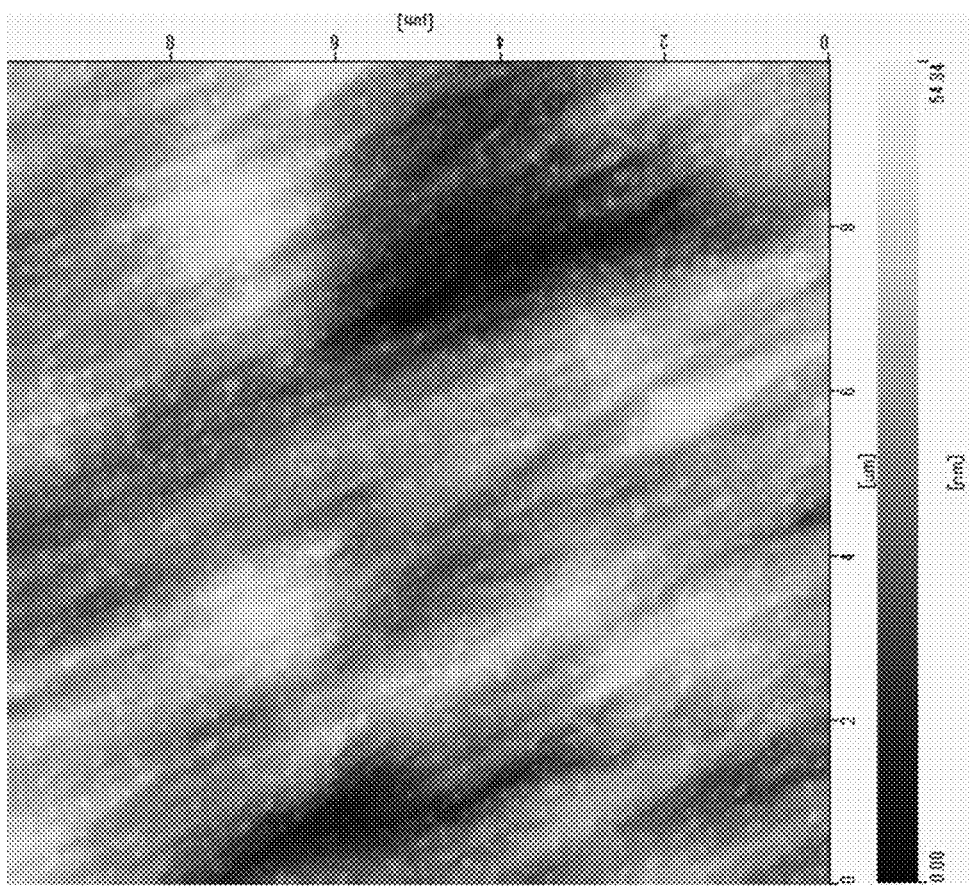
FIG. 22 illustrates an AFM image of a crystalline film in another Example.

The crystalline film thus obtained was clean crystal without cloudiness. A phase of the crystalline film thus obtained was identified in the same manner as in Example 1 to find out that the film thus obtained was α-Ga$_2$O$_3$. A surface of the crystalline film thus obtained was subjected to AFM measurement. The result is illustrated in FIG. 22.

Example 14

A multilayer structure was obtained in the same manner as in Example 1 other than using a c-plane sapphire substrate having an off angle of 12° as the crystal substrate, changing the film formation temperature to 580° C., and changing the film formation time to 130 minutes.

Figure 23:
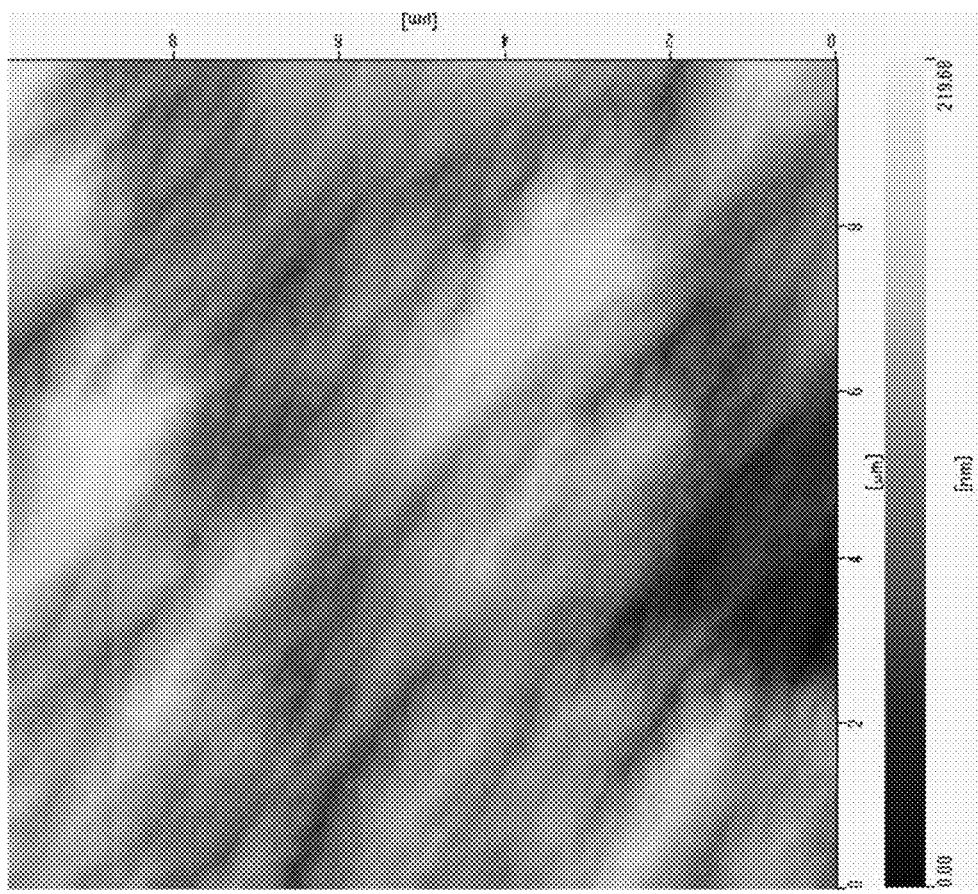
FIG. 23 illustrates an AFM image of a crystalline film in still another Example.

The crystalline film thus obtained was clean crystal without cloudiness. A phase of the crystalline film thus obtained was identified in the same manner as in Example 1 to find out that the film thus obtained was α-$Ga_2O_3$. A surface of the crystalline film thus obtained was subjected to AFM measurement. The result is illustrated in FIG. 23.

INDUSTRIAL APPLICABILITY

The multilayer structure of the present invention is applicable to a wide variety of fields, such as semiconductors (e.g., compound semiconductor electronic devices, etc.), electronic and electrical components, optical and electronic photograph related devices, and industrial parts. The structure is excellent in semiconductor properties, and thus particularly useful for semiconductor devices.

REFERENCE SIGNS LIST

19 Mist CVD Apparatus
20 Crystal Substrate
21 Susceptor
22 Carrier Gas Supply Means
23 Flow Regulating Valve
24 Mist Generator
24a Raw-Material Solution
25 Container
25a Water
26 Ultrasonic Vibration Transducer
27 Film Formation Chamber
28 Heater
51 Susceptor
52 Mist Acceleration Means
53 Substrate Holder
54 Support Unit
55 Supply Pipe
61 Substrate-Susceptor Region
62 Exhaust Region
101a n– Type Semiconductor Layer
101b n+ Type Semiconductor Layer
102 p Type Semiconductor Layer
103 Metal Layer
104 Insulating Layer
105a Schottky Electrode
105b Ohmic Electrode
111a n– Type Semiconductor Layer
111b n+Type Semiconductor Layer
114 Semi-Insulating Layer
115a Gate Electrode
115b Source Electrode
115c Drain Electrode
118 Buffer Layer
121a n Type Semiconductor Layer with Wide Band Gap
121b n Type Semiconductor Layer with Narrow Band Gap
121c n+ Type Semiconductor Layer
123 p Type Semiconductor Layer
124 Semi-Insulating Layer
125a Gate Electrode
125b Source Electrode
125c Drain Electrode
128 Buffer Layer
129 Substrate
131a n– Type Semiconductor Layer
131b First n+ Type Semiconductor Layer
131c Second n+ Type Semiconductor Layer
132 p Type Semiconductor Layer
134 Gate Insulating Film
135a Gate Electrode
135b Source Electrode
135c Drain Electrode
138 Buffer Layer
139 Semi-Insulating Layer
141a n- Type Semiconductor Layer
141b First n+ Type Semiconductor Layer
141c Second n+ Type Semiconductor Layer
142 p Type Semiconductor Layer
145a Gate Electrode
145b Source Electrode
145c Drain Electrode
151 n Type Semiconductor Layer
151a n– Type Semiconductor Layer
151b n+ Type Semiconductor Layer
152 p Type Semiconductor Layer
154 Gate Insulating Film
155a Gate Electrode
155b Emitter Electrode
155c Collector Electrode
161 n Type Semiconductor Layer
162 p Type Semiconductor Layer
163 Light Emitting Layer
165a First Electrode
165b Second Electrode
167 Translucent Electrode
169 Substrate

The invention claimed is:

1. A crystalline film, comprising: a corundum structured crystalline oxide as a major component, wherein
the crystalline film has an off angle from 0.2° to 12.0°, and
the corundum structured crystalline oxide contains gallium that accounts for 50 percent or more of the entire components comprised in the crystalline film.

2. The crystalline film of claim 1, wherein the off angle of the crystalline film is from 1° to 8°.

3. The crystalline film of claim 1, wherein the crystalline film is a c-, m-, a-, or r-plane crystalline film.

4. The crystalline film of claim 1, wherein a film thickness of the crystalline film is 1μm or more.

5. The crystalline film of claim 1, wherein a center line average roughness(Ra) of a film surface of the crystalline film is 10 nm or less and a maximum difference in elevation (P-V value) of the film surface is 100 nm or less, measured using an atomic force microscope.

6. The crystalline film of claim 1, wherein the crystalline oxide is a semiconductor.

7. The crystalline film of claim 6, wherein the crystalline film further contains a dopant.

8. The crystalline film according to claim 7, wherein the dopant contained in the crystalline film comprises an n-type dopant.

9. The crystalline film according to claim 7, wherein the dopant has a concentration that is in a range of $1\times10^{16}/cm^3$ to $1\times10^{22}/cm^3$.

10. A semiconductor device, comprising:
stalline film of claim 6; and
an electrode that is on the crystalline film.

11. The semiconductor device according to claim 10, wherein the electrode comprises a metal selected among Al, Mo, Co, Zr, Sn, Nb, Fe, Cr, Ta, Ti, Au, Pt, V, Mn, Ni, Cu, Hf, W, Ir, Zn, In, Pd, Nd, and Ag.

12. The semiconductor device according to claim 10, wherein the electrode comprises an alloy selected among Al, Mo, Co, Zr, Sn, Nb, Fe, Cr, Ta, Ti, Au, Pt, V, Mn, Ni, Cu, Hf, W, Ir, Zn, In, Pd, Nd, and Ag.

13. The semiconductor device according to claim 10, wherein the electrode comprises a metal oxide conductive film.

14. The semiconductor device according to claim 10, wherein the electrode comprises an organic conductive compound.

15. The crystalline film according to claim 1, wherein the crystalline film comprises a mixed crystal.

16. The crystalline film according to claim 1, wherein the corundum structured crystalline oxide contains indium.

17. The crystalline film according to claim 1. wherein the corundum structured crystalline oxide contains aluminum.

18. The crystalline film according to claim 17, wherein the corundum structured crystalline oxide contains indium.

19. The crystalline film according to claim 1, wherein the crystalline film comprises a dopant.

20. A semiconductor device comprising:
a crystalline film comprising a corundum structured crystalline oxide as a major component and a dopant, wherein the corundum structured crystalline oxide contains gallium that accounts for 50 percent or more of the entire components comprised in the crystalline film, and the crystalline film has an off angle 0.2° to 12.0°; and
an electrode that is on the crystalline film.

* * * * *

UNITED STATES PATENT AND TRADEMARK OFFICE
CERTIFICATE OF CORRECTION

PATENT NO. : 10,043,664 B2  
APPLICATION NO. : 15/508465  
DATED : August 7, 2018  
INVENTOR(S) : M. Oda et al.

Page 1 of 1

It is certified that error appears in the above-identified patent and that said Letters Patent is hereby corrected as shown below:

In the Claims

| Column | Line | Error |
|---|---|---|
| 22 (Claim 10, Line 2) | 58 | "stalline film of claim 6" should read --the crystalline film of claim 6-- |
| 23 (Claim 20, Line 7) | 23 | "off angle" should read --off angle from-- |

Signed and Sealed this  
Sixth Day of November, 2018

Andrei Iancu  
*Director of the United States Patent and Trademark Office*